(12) United States Patent
Foad et al.

(10) Patent No.: US 9,685,186 B2
(45) Date of Patent: Jun. 20, 2017

(54) HDD PATTERN IMPLANT SYSTEM

(75) Inventors: Majeed A. Foad, Sunnyvale, CA (US); Jacob Newman, Palo Alto, CA (US); Jose Antonio Marin, San Jose, CA (US); Daniel J. Hoffman, Fort Collins, CO (US); Stephen Moffatt, St. Lawrence (JE); Steven Verhaverbeke, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 888 days.

(21) Appl. No.: 12/703,897

(22) Filed: Feb. 11, 2010

(65) Prior Publication Data

US 2010/0221583 A1    Sep. 2, 2010

Related U.S. Application Data

(60) Provisional application No. 61/156,194, filed on Feb. 27, 2009, provisional application No. 61/185,111, filed on Jun. 8, 2009.

(51) Int. Cl.
   *G11B 5/85*    (2006.01)
   *C23C 16/00*   (2006.01)
   (Continued)

(52) U.S. Cl.
   CPC ............... *G11B 5/82* (2013.01); *C23C 16/00* (2013.01); *C23F 1/00* (2013.01); *G11B 5/84* (2013.01);
   (Continued)

(58) Field of Classification Search
   None
   See application file for complete search history.

(56) References Cited

U.S. PATENT DOCUMENTS 3,469,686 A * 9/1969 Gutsche et al. .............. 206/712
3,967,002 A    6/1976 Almasi et al.
(Continued)

FOREIGN PATENT DOCUMENTS

DE    271191 A1    8/1989
JP    03105721 A   5/1991
(Continued)

OTHER PUBLICATIONS

Derwent Abstract Translation of WO 2008-156189 A1 (Derwent-Acc-No. 2009-A91302) (patent published Dec. 2008).*
(Continued)

*Primary Examiner* — Kevin Bernatz
(74) *Attorney, Agent, or Firm* — Patterson + Sheridan, LLP

(57) ABSTRACT

Methods and apparatus for forming substrates having magnetically patterned surfaces is provided. A magnetic layer comprising one or more materials having magnetic properties is formed on a substrate. The magnetic layer is subjected to a patterning process in which selected portions of the surface of the magnetic layer are altered such that the altered portions have different magnetic properties from the non-altered portions without changing the topography of the substrate. A protective layer and a lubricant layer are deposited over the patterned magnetic layer. The patterning is accomplished through a number of processes that expose substrates to energy of varying forms. Apparatus and methods disclosed herein enable processing of two major surfaces of a substrate simultaneously, or sequentially by flipping. In some embodiments, magnetic properties of the substrate surface may be uniformly altered by plasma exposure and then selectively restored by exposure to patterned energy.

19 Claims, 10 Drawing Sheets

(51) Int. Cl.
*G11B 5/82* (2006.01)
*C23F 1/00* (2006.01)
*H01L 21/673* (2006.01)
*G11B 5/84* (2006.01)
*H01L 21/677* (2006.01)
*G11B 5/855* (2006.01)
*C23C 14/48* (2006.01)
*H01L 21/687* (2006.01)
*C23C 14/50* (2006.01)

(52) U.S. Cl.
CPC ............ *G11B 5/855* (2013.01); *H01L 21/673* (2013.01); *H01L 21/677* (2013.01); *C23C 14/48* (2013.01); *C23C 14/50* (2013.01); *H01L 21/687* (2013.01)

(56) References Cited

U.S. PATENT DOCUMENTS

| | | | |
|---|---|---|---|
| 4,314,894 A | 2/1982 | Schmelzer et al. | |
| 4,556,597 A | 12/1985 | Best et al. | |
| 4,669,004 A | 5/1987 | Moon et al. | |
| 4,684,547 A | 8/1987 | DiStefano et al. | |
| 4,935,278 A | 6/1990 | Krounbi et al. | |
| 5,220,476 A | 6/1993 | Godwin et al. | |
| 5,232,566 A | 8/1993 | Edmonson et al. | |
| 5,723,033 A | 3/1998 | Weiss | |
| 5,743,965 A * | 4/1998 | Nishimura | B05C 11/08 118/319 |
| 5,814,196 A * | 9/1998 | Hollars et al. | 204/298.15 |
| 5,858,474 A | 1/1999 | Meyer et al. | |
| 5,991,104 A | 11/1999 | Bonyhard | |
| 6,014,296 A | 1/2000 | Ichihara et al. | |
| 6,055,139 A | 4/2000 | Ohtsuka et al. | |
| 6,086,961 A | 7/2000 | Bonyhard | |
| 6,139,243 A * | 10/2000 | Jackson | B65G 47/252 198/403 |
| 6,168,845 B1 | 1/2001 | Fontana, Jr. et al. | |
| 6,319,373 B2 * | 11/2001 | Takeyama et al. | 204/298.25 |
| 6,368,425 B1 | 4/2002 | Segar et al. | |
| 6,368,678 B1 * | 4/2002 | Bluck et al. | 427/569 |
| 6,383,574 B1 | 5/2002 | Han et al. | |
| 6,510,015 B2 | 1/2003 | Ellis et al. | |
| 6,656,614 B1 | 12/2003 | Li et al. | |
| 6,749,907 B2 | 6/2004 | Heckmeier et al. | |
| 6,753,043 B1 | 6/2004 | Kuo et al. | |
| 6,843,892 B1 * | 1/2005 | McLeod | C23C 14/50 118/500 |
| 6,864,042 B1 | 3/2005 | Kuo et al. | |
| 6,886,244 B1 * | 5/2005 | McLeod et al. | 29/831 |
| 6,898,031 B1 | 5/2005 | Belser et al. | |
| 6,987,272 B2 * | 1/2006 | Ota et al. | 250/442.11 |
| 7,038,225 B2 | 5/2006 | Kuo et al. | |
| 7,041,202 B2 * | 5/2006 | McLeod | 204/192.12 |
| 7,050,248 B1 | 5/2006 | Wang | |
| 7,235,139 B2 * | 6/2007 | Boguslavskiy et al. | 118/728 |
| 7,394,202 B2 | 7/2008 | Horsky et al. | |
| 7,408,729 B2 | 8/2008 | Brooks et al. | |
| 7,465,478 B2 | 12/2008 | Collins et al. | |
| 7,479,643 B2 | 1/2009 | Horsky | |
| 7,670,529 B2 * | 3/2010 | Choi et al. | 264/293 |
| 7,675,048 B2 * | 3/2010 | Binns et al. | 250/492.21 |
| 7,780,821 B2 * | 8/2010 | Nolan et al. | 204/192.26 |
| 7,824,497 B2 * | 11/2010 | Watanabe et al. | 118/719 |
| 8,177,469 B2 * | 5/2012 | Peinovich | 414/226.05 |
| 8,303,716 B2 * | 11/2012 | Wallace | H01L 21/67109 118/724 |
| 8,911,554 B2 * | 12/2014 | Verhaverbeke | C23C 14/48 118/719 |
| 2003/0019739 A1 | 1/2003 | Shibamoto et al. | |
| 2003/0129850 A1 | 7/2003 | Olgado et al. | |
| 2004/0259036 A1 | 12/2004 | Chappert et al. | |
| 2007/0132152 A1 * | 6/2007 | Choi | B82Y 10/00 264/401 |
| 2008/0076268 A1 * | 3/2008 | Kraus et al. | 438/785 |
| 2008/0280453 A1 * | 11/2008 | Koelmel | H01L 21/67115 438/758 |
| 2010/0053813 A1 | 3/2010 | Fukushima et al. | |
| 2010/0165504 A1 * | 7/2010 | Fukushima et al. | 360/75 |
| 2010/0221583 A1 * | 9/2010 | Foad | G11B 5/82 428/846 |
| 2010/0329827 A1 * | 12/2010 | Hoey | H01L 21/67173 414/217 |
| 2011/0000882 A1 * | 1/2011 | Foote et al. | 216/67 |

FOREIGN PATENT DOCUMENTS

| | | |
|---|---|---|
| JP | 2009026435 A | 2/2009 |
| JP | 2009205777 A | 9/2009 |
| KR | 20090011519 | 2/2009 |

OTHER PUBLICATIONS

Lohau, et al. "Effect of Ion Beam Patterning on the Write and Read Performance of Perpendicular Granular Recording Media," IEEE Transactions on Magnetics vol. 37, No. 4 (Jul. 2001), pp. 1652-1656.

Irene Hu "Nanoscale Focused Ion Beam Patterning and Characterization of Perpendicular Magnetic Recording media" NNIN REU 2006 Research Accomplishment, pp. 122-123.

International Search Report and Written Opinion of the International Searching Authority mailed Sep. 15, 2010 in PCT/US2010/024163.

* cited by examiner

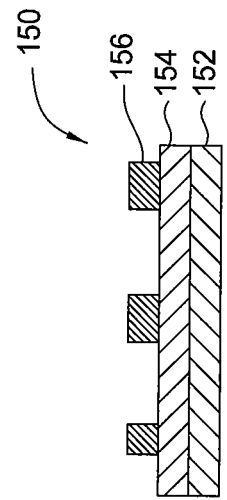
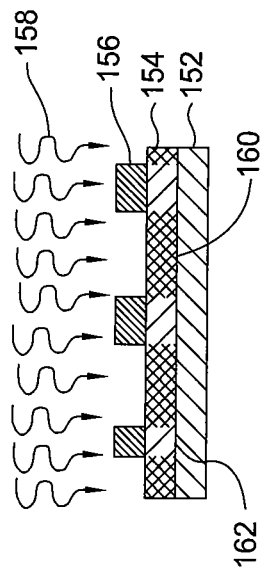
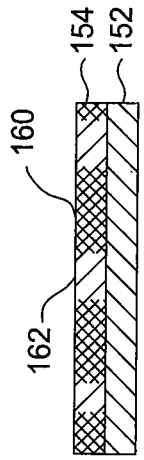
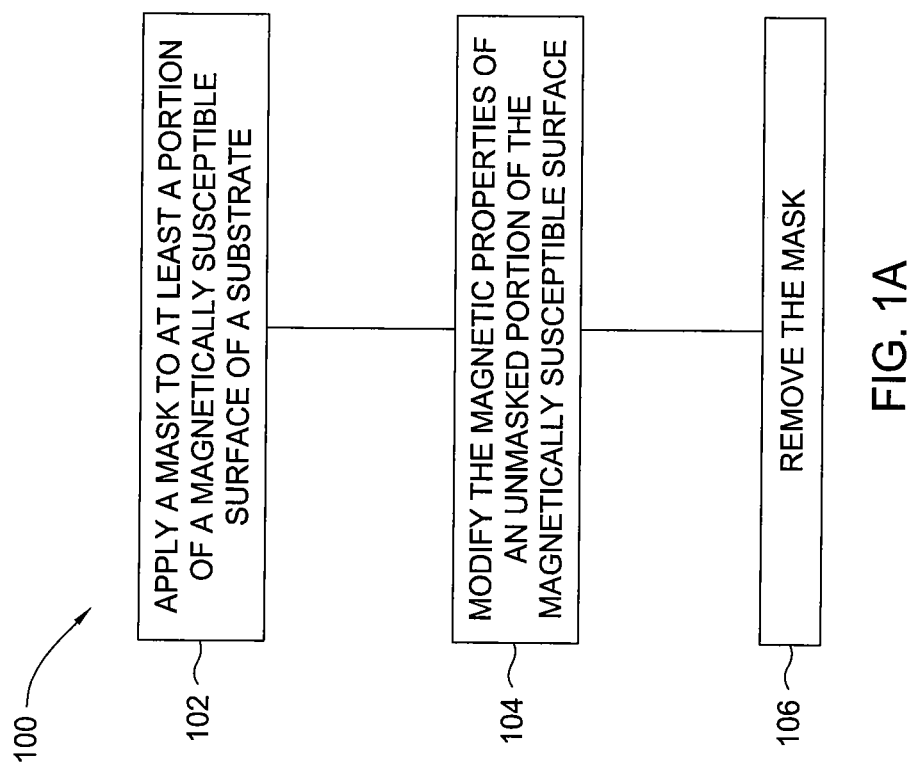

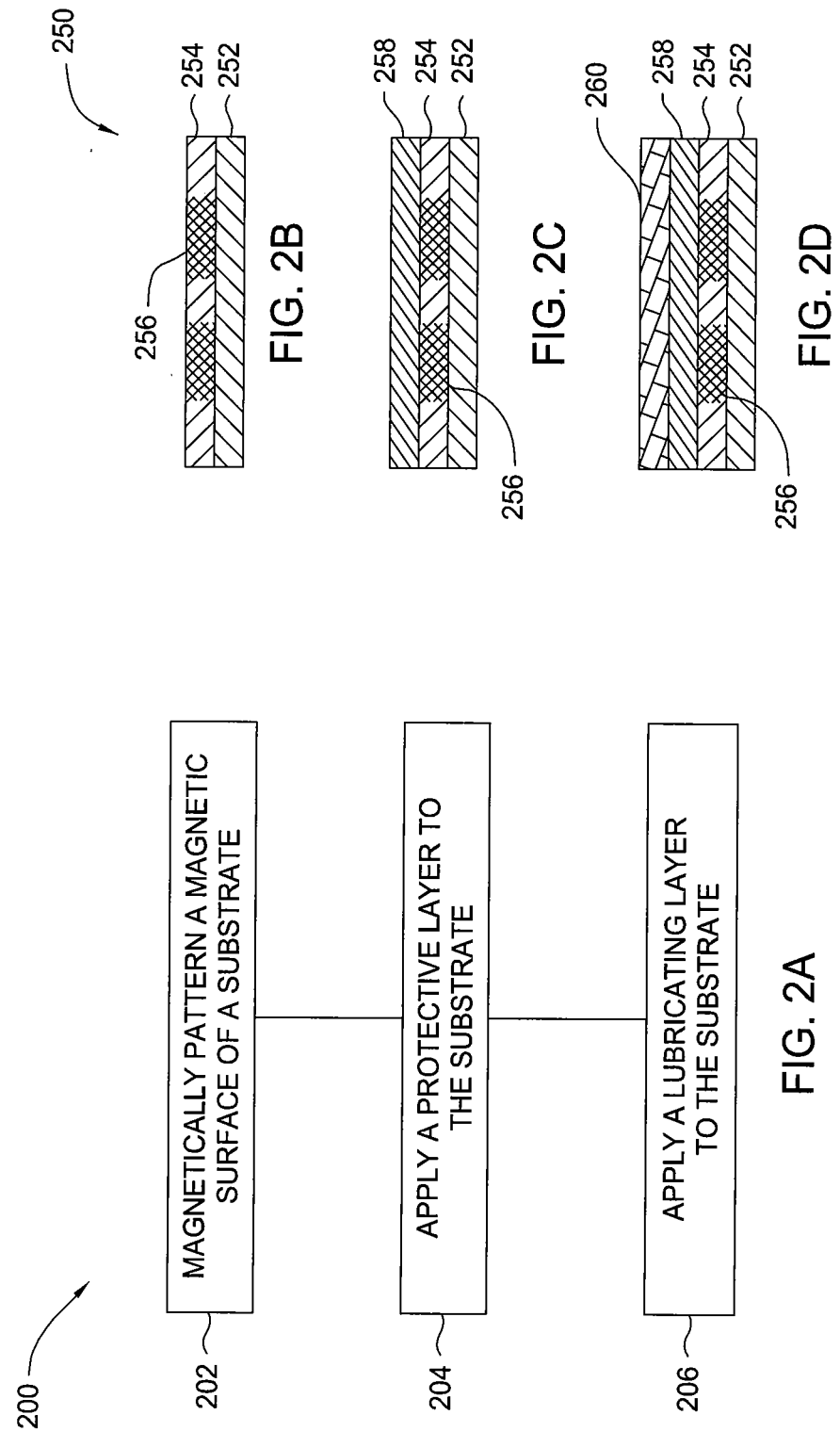

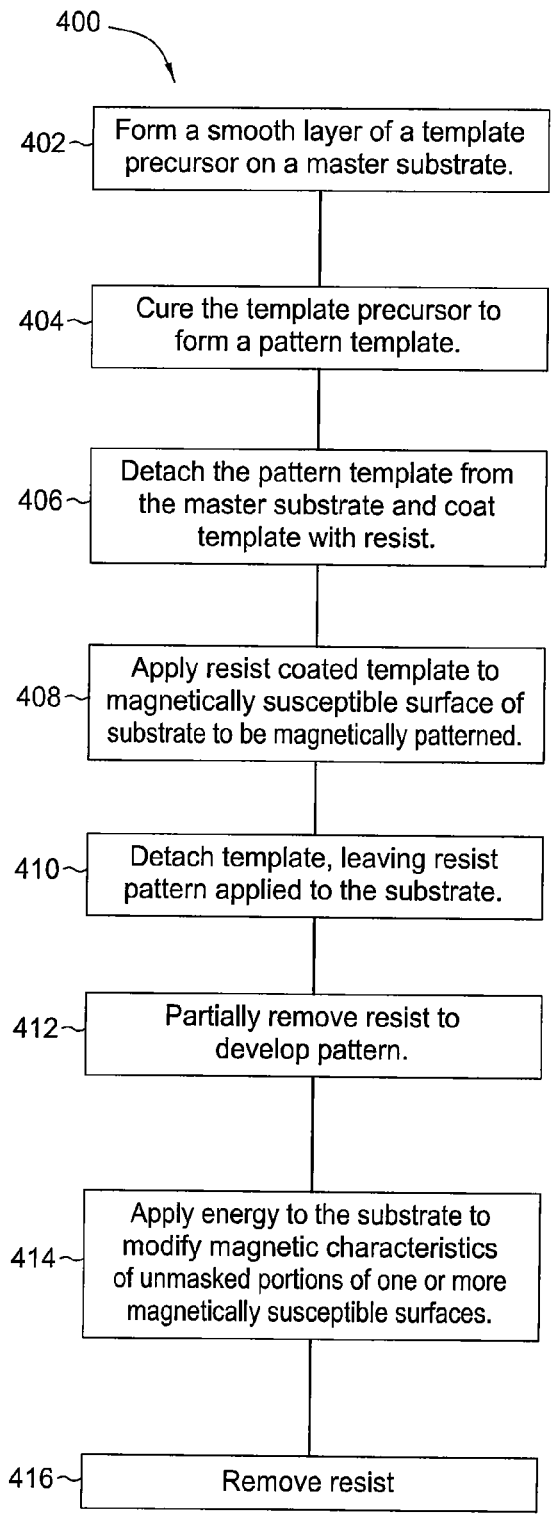

400

402 — Form a smooth layer of a template precursor on a master substrate.

404 — Cure the template precursor to form a pattern template.

406 — Detach the pattern template from the master substrate and coat template with resist.

408 — Apply resist coated template to magnetically susceptible surface of substrate to be magnetically patterned.

410 — Detach template, leaving resist pattern applied to the substrate.

412 — Partially remove resist to develop pattern.

414 — Apply energy to the substrate to modify magnetic characteristics of unmasked portions of one or more magnetically susceptible surfaces.

416 — Remove resist

FIG. 4A

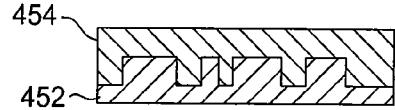
FIG. 4B

FIG. 4C

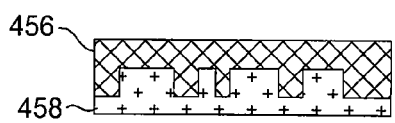
FIG. 4D

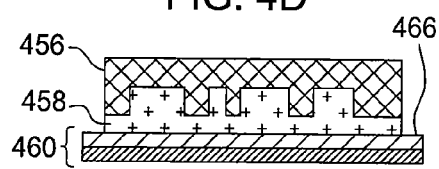
FIG. 4E

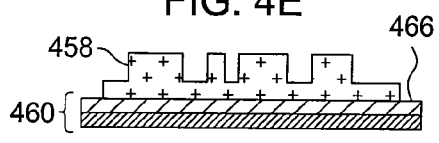
FIG. 4F

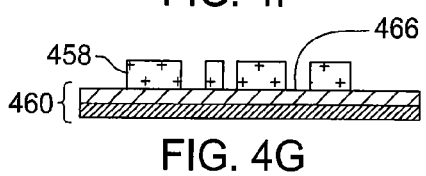
FIG. 4G

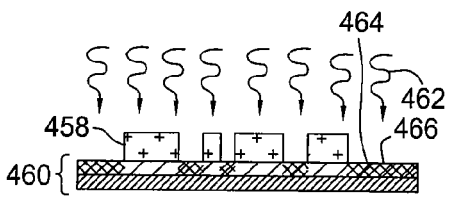
FIG. 4H

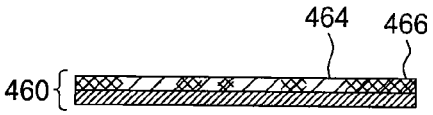
FIG. 4I

HDD PATTERN IMPLANT SYSTEM

CROSS-REFERENCE TO RELATED APPLICATIONS

This application claims benefit of U.S. Provisional Patent Application Ser. No. 61/156,194 filed Feb. 27, 2009, and U.S. Provisional Patent Application Ser. No. 61/185,111 filed Jun. 8, 2009.

FIELD

Embodiments of the invention relate to hard-disk drive media, and apparatus and methods for making hard-disk drive media. More specifically, embodiments of the invention relate to methods and apparatus for forming a patterned magnetic medium for a hard-disk drive.

BACKGROUND

Hard-disk drives are the storage medium of choice for computers and related devices. They are found in most desktop and laptop computers, and may also be found in a number of consumer electronic devices, such as media recorders and players, and instruments for collecting and recording data. Hard-disk drives are also deployed in arrays for network storage.

Hard-disk drives store information magnetically. The disk in a hard-disk drive is configured with magnetic domains that are separately addressable by a magnetic head. The magnetic head moves into proximity with a magnetic domain and alters the magnetic properties of the domain to record information. To recover the recorded information, the magnetic head moves into proximity with the domain and detects the magnetic properties of the domain. The magnetic properties of the domain are generally interpreted as corresponding to one of two possible states, the "0" state and the "1" state. In this way, digital information may be recorded on the magnetic medium and recovered thereafter.

The magnetic medium in a hard-disk drive is generally a glass, composite glass/ceramic, or metal substrate, which is generally non-magnetic, with a magnetically susceptible material deposited thereon. The magnetically susceptible layer is generally deposited to form a pattern, such that the surface of the disk has areas of magnetic susceptibility interspersed with areas of magnetic inactivity. The non-magnetic substrate is usually topographically patterned, and the magnetically susceptible material deposited by spin-coating or electroplating. The disk may then be polished or planarized to expose the non-magnetic boundaries around the magnetic domains. In some cases, the magnetic material is deposited in a patterned way to form magnetic grains or dots separated by a non-magnetic area.

Such methods are expected to yield storage structures capable of supporting data density up to about 1 TB/in$^2$, with individual domains having dimensions as small as 20 nm. Where domains with different spin orientations meet, there is a region referred to as a Bloch wall in which the spin orientation goes through a transition from the first orientation to the second. The width of this transition region limits the areal density of information storage because the Bloch wall occupies an increasing portion of the total magnetic domain.

To overcome the limit due to Bloch wall width in continuous magnetic thin films, the domains can be physically separated by a non-magnetic region (which can be narrower than the width of a Bloch wall in a continuous magnetic thin film). Conventional approaches to creating discrete magnetic and non-magnetic areas on a medium have focused on forming single bit magnetic domains that are completely separate from each other, either by depositing the magnetic domains as separate islands or by removing material from a continuous magnetic film to physically separate the magnetic domains. A substrate may be masked and patterned, and a magnetic material deposited over exposed portions, or the magnetic material may be deposited before masking and patterning, and then etched away in exposed portions. In either case, the topography of the substrate is altered by the residual pattern of the magnetic regions. Because the read-write head of a typical hard-disk drive may fly as close as 2 nm from the surface of the disk, these topographic alterations can become limiting. Thus, there is a need for a process or method of patterning magnetic media that has high resolution and does not alter the topography of the media, and an apparatus for performing the process or method efficiently for high volume manufacturing.

SUMMARY

Embodiments described herein provide apparatus for processing magnetic substrates, with a processing chamber with an inductive plasma source, a stage adjacent to the processing chamber, a substrate loader coupled to the stage and the processing chamber, and means for modifying the magnetic properties of at least two major surfaces of each substrate that exposes the two major surfaces of each substrate to the inductive plasma source in a patterned way.

Other embodiments provide apparatus for processing one or more substrates, with a plurality of processing chambers, each chamber comprising a substrate support with a plurality of laterally displaced substrate holding sites, a plasma source facing the substrate support, and a gas source, a stage adjacent to the processing chambers for holding one or more substrates, and a substrate loader coupled with the processing chambers and the stage.

Other embodiments provide apparatus for processing magnetic substrates, with a plurality of processing chambers, at least one of which has a substrate support with a plurality of laterally displaced substrate locations disposed therein, a transfer chamber coupled to the processing chambers, and a robot that rotates a substrate about an axis parallel to a diameter of the substrate.

Other embodiments provide methods of creating a pattern of magnetic domains on a magnetically susceptible surface of one or more substrates by applying a mask to at least a portion of the magnetically susceptible surface to form a masked portion and an unmasked portion of the surface, modifying the magnetic characteristics of the unmasked portion of the magnetically susceptible surface by exposing the surface to a plasma immersion ion implantation process comprising ions having average energy between about 0.2 keV and 4.8 keV, and removing the mask.

Other embodiments provide methods of forming a magnetic medium for a hard disk drive by forming a magnetic layer on at least two major surfaces of a substrate, forming a patterned mask over the magnetic layer on the at least two major surfaces of the substrate to form a masked portion and an unmasked portion of the magnetic layer, and modifying the magnetic properties of the unmasked portion of the at least two major surfaces of the substrate by exposing the unmasked portion to a plasma.

Other embodiments provide substrates that have a magnetically susceptible layer having a first plurality of domains with a first magnetic characteristic and a second plurality of domains with a second magnetic characteristic measurably different from the first magnetic characteristic, wherein each domain of the first and second plurality of domains has a dimension parallel to the plane defined by the substrate of not more than about 50 nm, a protective layer adjacent to the magnetically susceptible layer, and a lubricating layer adjacent to the protective layer.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1A is a flow diagram summarizing a method according to one embodiment.

FIGS. 1B-1D are schematic side views of a substrate at various stages of the method of FIG. 1A.

FIG. 2A is a flow diagram summarizing a method according to another embodiment.

FIGS. 2B-2D are schematic side views of a substrate at various stages of the method of FIG. 2A.

FIG. 4A is a flow diagram summarizing a process according to an embodiment.

FIGS. 4B-4I are schematic side views showing various substrates at different stages of the process of FIG. 4A.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 3A:
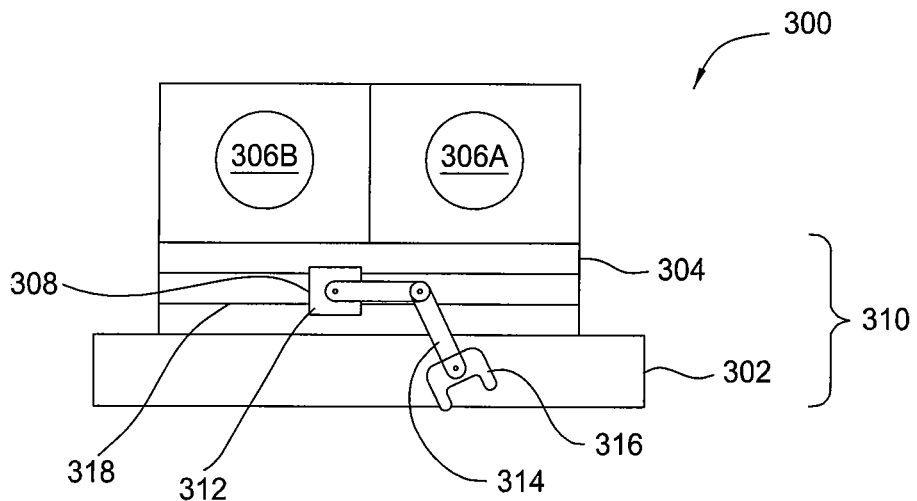
FIG. 3A is a plan view of a substrate processing apparatus according to another embodiment.

Embodiments of the invention generally provide apparatus and methods for processing magnetic media substrates for hard disk drives. The apparatus and methods modify the magnetic properties of the substrate by applying energy to the substrate in a patterned way to create magnetic domains with different properties detectable and changeable by a magnetic head. The magnetic domains are separately addressable by a magnetic head held in proximity to the substrate surface, enabling the magnetic head to detect and affect the magnetic properties of an individual magnetic domain. Embodiments of the invention create magnetic domains having a dimension less than about 25 nm while preserving the topography of the substrate.

The substrates used are generally metal or glass, and may be metal alloys or composite glass substances such as glass/ceramic blends. The substrates are generally coated with a magnetically susceptible material that provides a medium for magnetic patterning. The magnetically susceptible material may be formed in multiple layers, each layer having the same or different composition. In one embodiment, a first layer of soft magnetic material, such as iron or and iron/nickel alloy, is formed over the base substrate, and a second layer of magnetic material, such as a cobalt/nickel/platinum alloy, is formed over the first layer. These layers may be formed by any suitable method known to the art, such as physical vapor deposition, or sputtering, chemical vapor deposition, plasma-enhanced chemical vapor deposition, spin-coating, plating by electrochemical or electroless means, and the like.

Following formation of a magnetic pattern in the magnetically susceptible material, described in more detail below, a protective layer is formed over the magnetically susceptible layer to prevent contact between the magnetic head and the magnetic medium. The protective layer is preferably magnetically inactive, and in some embodiments comprises carbon, such as amorphous or diamond-like carbon, or carbon nitride. The protective layer is also generally very thin, such as less than about 10 nm in thickness.

A lubricating layer may be formed over the protective layer to protect the magnetic head in the event of contact between the head and the substrate. The lubricating layer may be a lubricious polymer, such as a fluoropolymer, and may be deposited by any convenient method. The lubricating layer will also generally be thin, such as less than about 50 nm in thickness.

Embodiments of the invention provide methods and apparatus for establishing a magnetic pattern in one or more surfaces of a hard disk medium through a physical patterning process. A pattern template is coated with a mask material, and the template applied to the substrate to be patterned. The mask material is thus applied to the substrate according to the pattern of the template. A very detailed pattern having features of dimension less than about 25 nm may be imprinted on the substrate in this way. The mask may leave portions of the substrate completely exposed, or may cover some portions with a thin mask layer and others with a thick mask layer. The portions of the substrate that remain exposed, or covered with a thin mask layer, are essentially unmasked, while the other portions are masked. Unmasked portions of the substrate may then be exposed to energy to alter the magnetic properties of the unmasked portions. Upon removal of the mask, the substrate is left with its original topography, but with a very fine pattern of magnetic and non-magnetic domains capable of supporting storage densities in excess of 1 Tb/in$^2$.

FIG. 1A is a flow diagram summarizing a method 100 according to one embodiment of the invention. FIGS. 1B-1D are schematic cross-sectional views of a substrate 150 at various stages of the process of FIG. 1A. The substrate 150 has a base layer 152 and a magnetically susceptible layer 154. The base layer 152 is generally a structurally strong material such as metal, glass, ceramic, or a combination thereof. Many substrates commonly feature an aluminum or glass base layer, but other embodiments may feature carbon composite materials. The base layer 152 provides structural strength and good adhesion to the magnetically susceptible layer 154, and is generally magnetically impermeable with diamagnetic, or only very weak paramagnetic, properties. For example, in some embodiments, the magnetic susceptibility of the base layer is below about $10^{-4}$ (the magnetic susceptibility of aluminum is about $1.2\times10^{-5}$).

The magnetically susceptible layer 154 is generally formed from one or more ferromagnetic materials. In some embodiments, the layer 154 comprises a plurality of layers having the same or different composition. In one embodiment, the layer 154 comprises a first layer and a second layer, wherein the first layer is a soft magnetic material, which is generally defined as a material with low magnetic coercivity, and the second layer has higher coercivity than the first layer. In some embodiments, the first layer may comprise iron, nickel, platinum, or combinations thereof. In some embodiments, the first layer may comprise a plurality of sub-layers having the same or different compositions. The second layer may also comprise a variety of materials, such as cobalt, chromium, platinum, tantalum, iron, terbium, gadolinium, or combinations thereof. The second layer may also comprise a plurality of sub-layers having the same or different compositions. In one embodiment, the magnetically susceptible layer 154 comprises a first layer of iron or iron/nickel alloy having a thickness between about 100 nm and about 1,000 nm (1 μm) and a second layer comprising two sub-layers, each having a thickness between about 30 nm and about 70 nm, such as about 50 nm, and each comprising chromium, cobalt, and platinum.

The magnetic surface is patterned to form domains of varying magnetic activity. To create the domain pattern, a mask material 156 is applied to the substrate 150 at 102. The mask material 156 generally comprises a material that can be readily removed without altering the magnetically susceptible layer 154 in any way, or a material that will not adversely affect the device properties if it is not removed. For example, in many embodiments, the mask material is soluble in a solvent liquid, such as water or hydrocarbon. In some embodiments, the mask is applied to the substrate as a curable liquid, patterned by physical imprint with a template, and cured by heating or UV exposure. In other embodiments, the mask is applied to the template and at least partially cured before applying the coated template to the substrate. The mask material 156 is generally also resistant to degradation by incident energy or energetic ions. In some embodiments, the mask material 156 is a curable material, such as an epoxy or thermoplastic polymer, that will flow prior to being cured and will provide some resistance to energetic processes after curing. The mask material defines masked and unmasked portions of the magnetically susceptible layer 154.

At 104, the magnetic properties of the unmasked portions of the magnetically susceptible layer 154 are modified. Energy 158 is directed toward the substrate 150, and impinges on the exposed unmasked portions of the magnetically susceptible layer 154. Exposing magnetic materials to energy will generally begin to disrupt and change the magnetic properties when the energy reaches sufficient intensity to stimulate thermal motion of the atoms in the material. Energy above a certain threshold will randomize the spin direction of the atoms, reducing or eliminating the magnetic properties of the material. In some embodiments, the magnetism or the magnetic susceptibility of the magnetically susceptible layer 154 may be reduced or eliminated by exposure to the energy 158. Magnetic susceptibility is the ease with which a material will acquire magnetism when exposed to a magnetic field. Modification of the unmasked portions of the magnetically susceptible layer 154 creates a pattern of domains defined by the unmodified zones 162 and the modified zones 160. The pattern may be recognized as domains of magnetic and non-magnetic material, domains of high and low magnetic field, or domains of high and low magnetic susceptibility. The mask material 156 is then removed at 106, leaving the substrate with a magnetically susceptible layer 154 having a pattern of domains defined by unmodified zones 162 and modified zones 160, wherein the modified zones have lower magnetic activity than the unmodified zones. The resulting substrate 150 has substantially the same topography as it had before processing.

FIG. 2A is a flow diagram summarizing a method 200 according to another embodiment of the invention. FIGS. 2B-2D are schematic side-views of a substrate 250 at various stages of the method of FIG. 2A. At 202, a magnetic surface of a substrate is patterned into regions having different magnetic properties in a process similar to that described in connection with FIGS. 1A-1D. FIG. 2B shows the substrate 250 having a base layer 252 and a magnetic layer 254. The base layer 252 and magnetic layer 254 may have properties similar to the base layer 152 and magnetically susceptible layer 154 described above. The patterned areas 256 of the magnetic layer 254 have different magnetic properties from the unpatterned areas. For example, the patterned areas 256 may be substantially demagnetized, or their magnetism or magnetic susceptibility may have been reduced or altered.

At 204, a protective layer 258 is formed on the substrate over the magnetic layer. The protective layer 258 prevents interaction of the magnetic surface with any materials that might degrade its properties, such as oxygen or moisture. The protective layer 258 may also be a sealing layer in some embodiments. In some embodiments, the protective layer 258 may comprise carbon, may comprise carbon and nitrogen, may be a carbon and nitrogen containing layer, may be an amorphous carbon layer, or may be a carbon nitride layer. In other embodiments, the protective layer 258 may be a polymer, which may comprise carbon. In some embodiments, the protective layer 258 may be a plastic or thermoplastic material. The protective layer is generally deposited in a low temperature process to avoid altering the magnetic properties of the magnetic layer 254.

At 206, a lubricating layer 260 is formed over the substrate. The lubricating layer 260 provides protection for a magnetic device (not shown) configured to detect and change the magnetic properties of regions on the magnetic surface 254 of the substrate 250. In the event of contact between the magnetic device and the substrate surface, the lubricating layer 260 will minimize frictional forces on the magnetic device that may damage the device. In some embodiments, the lubricating layer 260 may be a polymer, a carbon containing polymer, a fluorine containing polymer, a fluorine and carbon containing polymer, a fluoropolymer, a crystalline layer, or a diamond-like carbon layer. The lubricating layer 260 is generally also deposited in a low temperature process.

The methods 100 and 200 of FIGS. 1A and 2A feature patterning of a substrate surface into regions having different magnetic properties. In some embodiments, this may be accomplished using means for exposing one or more surfaces of the substrate to one or more energy sources in a patterned way. In one embodiment, portions of the surface to be patterned or modified may be treated to a thermal process. Heating a magnetic substance to a temperature above its Curie temperature can eliminate any magnetism in the substance by dis-aligning magnetic moments within the substance. Thermal energy results in randomization of spin alignments at the atomic level, which destroys the inherent magnetic field of the substance. Selective heating of portions of the magnetic substance according to a pattern will yield a pattern of high and low magnetic activity in the substance.

In other embodiments, the magnetic properties of a substrate may be altered by exposure to energetic particles, such as ions, radicals, and neutral particles. In some embodiments, a substrate having a magnetic surface may be bombarded with ions. In other embodiments, the substrate may be implanted with ions. Bombarding the substrate without implanting ions will change the magnetic properties through a purely energetic or thermal process by transferring the kinetic energy of the energetic ions to the magnetic surface, thereby inducing differential randomization of magnetic moments with each collision. Implanting ions will change the magnetic properties through energetic as well as compositional effects. Implanted ions, such as boron, phosphorus, and arsenic ions, will not only randomize magnetic moments near the implant site, they will also impart their own magnetic properties to the surface, resulting in changed magnetic properties for the implanted region. In other embodiments, electrically neutral particles may be implanted into the surface.

Energetic ions may be produced by applying dissociative energy to a process gas. The dissociative energy is generally selected based on the process gas, and may be effective to dissociate electrons from atoms, as in an argon plasma, for example, or to dissociate atoms and fragments from molecules, as in a molecular plasma. The dissociative energy may be applied in the form of capacitative or inductive RF power, DC power, electromagnetic energy, or magnetron sputtering, depending on the embodiment. Ions generated by the dissociative energy may be accelerated toward the substrate using an electric field produced by applying a DC or RF electrical bias to the substrate support or to a gas inlet above the substrate support, or both. The ions may also be accelerated to a desired energy outside the processing chamber. In some embodiments, the ions may be subjected to a mass selection or mass filtration process, which may comprise passing the ions through a magnetic field aligned orthogonal to the desired direction of motion.

Ions of helium, hydrogen, oxygen, nitrogen, boron, phosphorus, arsenic, fluorine, silicon, platinum, aluminum, or argon may be used to alter the magnetic properties of a substrate surface. Ions of these elements are generally produced by providing a gas comprising the element to a chamber and applying an electric field to the gas. Boron, phosphorus, and arsenic ions may be generated by providing one or more hydrides, such as borane, phosphine, or arsine, or lower oligomers thereof, to a chamber and applying an electric field. The electric field may be capacitatively or inductively coupled for purposes of ionizing the atoms, and may be a DC discharge field or an alternating field, such as an RF field. Alternately, microwave energy may be applied to a precursor gas containing any of these elements to generate ions. In general, ion energy less than 5 keV is preferred for magnetic medium implant, such as between about 0.2 keV and about 4.8 keV, for example about 3.5 keV. In some embodiments, the gas containing energetic ions may be a plasma.

A gas comprising one or more of the elements indicated above may be provided to an ionizing chamber at a rate that is dependent on the size of the chamber, which is in turn dependent on the area of substrate surface to be processed. Generally, a flow rate between about 10 sccm and about 500 sccm is provided to the chamber. The chamber pressure is generally maintained between about 4 mTorr and about 100 mTorr, such as about 10 mTorr. The chamber will generally have a substrate support and a gas distributor in parallel opposition one to the other. An electrical bias of between about 50 V and about 500 V is applied to the substrate support, the gas distributor, or both, to accelerate the ions toward the substrate support with the desired energy. In some embodiments, the electrical bias is also used to ionize the process gas. In other embodiments, a second electric field is used to ionize the process gas. In one embodiment, a high-frequency RF field and a low-frequency RF field are provided to ionize the process gas and bias the substrate support. The high-frequency field is provided at a frequency of 13.56 MHz and a power level between about 200 W and about 5,000 W, and the low-frequency field is provided at a frequency between about 1,000 Hz and about 10 kHz at a power level between about 50 W and about 200 W. Energetic ions may be generated by an inductively coupled electric field by providing a recirculation pathway through an inductive coil powered by RF power between about 50 W and about 500 W. The ions thus produced will generally be accelerated toward the substrate by biasing the substrate or a gas distributor as described above.

In some embodiments, generation of ions may be pulsed. Power may be applied to the plasma source for a desired time, and then discontinued for a desired time. Power cycling may be repeated for a desired number of cycles at a desired frequency and duty cycle. In many embodiments, the plasma may be pulsed at a frequency between about 0.1 Hz and about 1,000 Hz, such as between about 10 Hz and about 500 Hz. In other embodiments, the plasma pulsing may proceed with a duty cycle (ratio of powered time to unpowered time per cycle) between about 10% and about 90%, such as between about 30% and about 70%.

Precursors comprising helium, hydrogen, oxygen, nitrogen, boron, fluorine, argon, silicon, sulphur, aluminum, lithium, neon, germanium, and carbon may be used to generate ions and neutrals for implanting into substrates. Helium, hydrogen, oxygen, nitrogen, fluorine, neon, and argon ions may be generated by applying an electric field to elemental gases. Boron, silicon, germanium, aluminum, sulphur, and carbon ions may be generated by applying an electric field to gases of small molecular species such as lower hydrides (borane, silane, germane, methane, or dimers thereof), organoaluminum compounds such as trimethylaluminum, or sulphur containing, organic compounds such as thiols. Combinations of ions and neutrals of different species may also be used by using mixtures derived from the above precursor groups. The ions are given momentum for implanting into the substrate by acceleration in an electric field created by biasing the substrate, gas distribution plate, or both.

In general, the magnetic properties of the magnetic layers of a substrate may be modified by exposure to energy carriers, such as ions, radicals, neutrals, electrons, or photons. The average energy of the carriers in most embodiments falls between about 0.2 keV and about 5.0 keV, such as between about 0.2 keV and about 4.8 keV, or between about 2.0 keV and about 4.0 keV, or between about 3.0 keV and about 4.0 keV, such as about 3.5 keV. In some embodiments, each energy carrier will have energy in one or more of the ranges described above. The exposure to the energy carriers will occur over a duration generally less than about 10 minutes, such as between about 10 seconds and about 5 minutes, for example between about 30 seconds and about 2 minutes, such as about 60 seconds. In some exposures, the duration will be about 60 seconds or less, for example between about 1 second and about 60 seconds, such as about 30 seconds or less, for example between about 1 second and about 30 seconds.

FIG. 3A is a plan view of an apparatus 300 according to one embodiment of the invention. The apparatus 300 of FIG. 3A is useful for performing processes provided by embodiments of the invention. The apparatus 300 comprises two processing chambers 306A and 306B coupled to a factory interface 304. Although the apparatus 300 is shown with two processing chambers, a similar configuration may be realized with a single chamber or with more than two chambers. The factory interface 304 comprises a substrate handler 308. The factory interface 304 is also coupled to a substrate holder 302. The factory interface 304, between the holder 302 and the process chambers 306A and 306B, moves substrates from the holder 302 into the chambers 306A and 306B, and then back to the holder 302. The factory interface 304 and the holder 302 together define a substrate loader 310, which has one or more stages within the holder 302 for staging substrates to be processed in the chambers 306A and 306B.

The handler 308 generally comprises a base 312, an articulated arm 314, and an extension 316. The base 312 is movably attached to an x-motion assembly 318. The x-motion assembly allows the handler 308 to move in a first direction and access all chambers coupled to the substrate loader 310. In some embodiments, the substrate loader 310 may also comprise a y-motion assembly, not shown in FIG. 3A, to enable the handler 308 to move in a second direction substantially perpendicular to the first direction. The articulated arm 314 is rotatably mounted on the base 312, and generally rotates about an axis parallel to the second direction through the base 312. The arm is articulated to extend into and retract from the holder 302 and the chambers 306A and 306B.

Figure 3B:
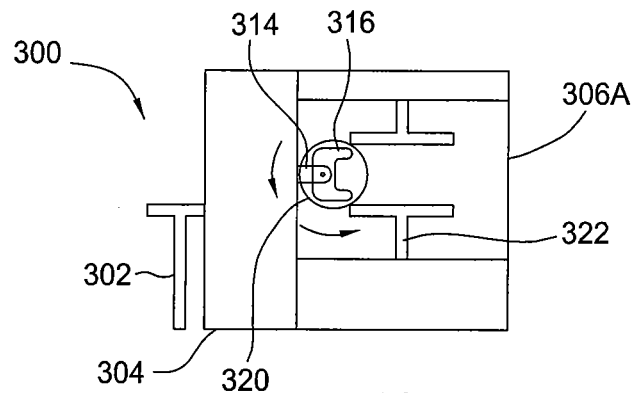
FIG. 3B is a side view of the apparatus of FIG. 3A.
Figure 3C:
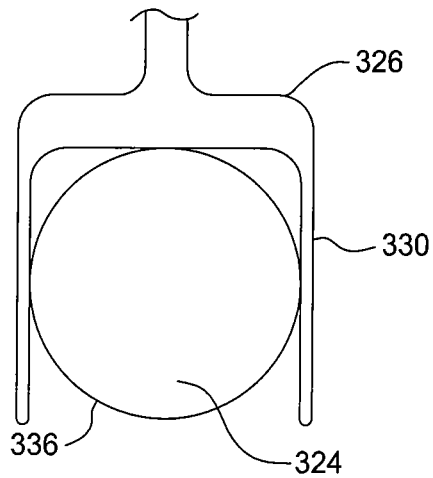
FIGS. 3C and 3D are detail views of extensions for substrate handlers according to two different embodiments.
Figure 3D:
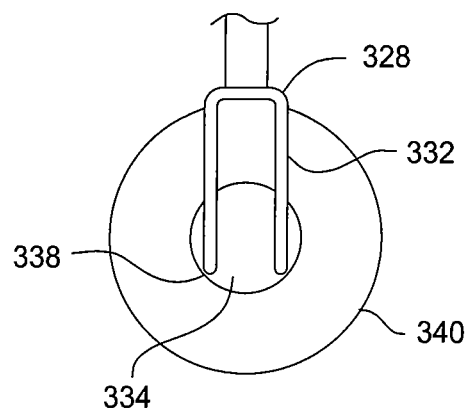

The extension 316 in the embodiment of FIG. 3A may be rotatably mounted on the articulated arm 314, and may also be configured to rotate about at least two orthogonal axes, at least one of which is substantially parallel to a portion of the articulated arm 314. In some embodiments, the extension 316 rotates about an axis parallel to the second direction perpendicular to the first direction motion of the base 312 along the x-motion assembly 318, and about an axis parallel to a portion of the articulated arm 314. In some embodiments, the modes of rotation described above enable the substrate handler 308 to flip a substrate over to allow processing on two major surfaces of a substrate. FIG. 3B is a schematic side view of the apparatus 300 of FIG. 3A. A substrate 320 is shown engaged with the extension 316, and in the process of being rotated or flipped for placement on a substrate support 322 inside the processing chamber 306A. FIGS. 3C and 3D show alternate embodiments of extensions 326 and 328 configured to engage two different substrates 324 and 340. In the embodiment of FIG. 3A, the extension 326 engages the substrate 324 using fingers 330 to contact an edge 336 of the substrate 324. Friction between the fingers 330 and the edge 336 of the substrate 324 enables the extension 326 to manipulate the substrate 324 in any way required without disengaging from the substrate 324. In the embodiment of FIG. 3D, similar fingers 332 of extension 328 are configured to contact an edge 338 of a substrate 340 formed by an opening 334 in the substrate 340. Friction between the fingers 332 and the edge 338 of the opening 334 similarly allows manipulation of the substrate 340 in any necessary way.

In operation, an extension such as the extensions 326 and 328 of FIGS. 3C and 3D may engage a substrate according to its particular mode thereof, and may move the substrate away from the substrate support. If the substrate support is a platform, the extension may engage the substrate while resting on the platform or while suspended over the platform on lift pins, as is commonly practiced. The handler to which the extension is attached may move the substrate into a manipulation position, after which the extension may rotate about an axis of the handler to turn the substrate over. The handler may then replace the substrate on the substrate support or lift pins, as required, for further processing.

FIG. 4A is a flow diagram summarizing a method 400 according to another embodiment of the invention. FIGS. 4B-4I show various articles used in the method 400 at various stages of the method 400. At 402, a template precursor material 454 is applied to a master substrate 452 to acquire a pattern. The master substrate 452 expresses the master pattern to be developed on successive substrates according to the method 400. The master substrate 452 may comprise any durable material, such as metal, glass, or ceramic, and may be invested with an original pattern through any suitable process, such as any patterning process, for example by a deposition or etching process, or a combination thereof. In one embodiment, the master substrate may be patterned by an e-beam process. The e-beam process may comprise direct engraving with an electron beam or electron beam lithography followed by etching. In another embodiment, UV photolithography may be used to pattern the master substrate 452. The template precursor material 454 may be applied to the master substrate 452 as a gas or a liquid, and is preferably applied to form a smooth layer over the master substrate 452 using any suitable process, such as spin coating, die coating, or vapor deposition. The surface of the template precursor material 454 that interfaces with the master substrate 452 thus acquires the pattern recorded in the master substrate 452. In some embodiments, the template precursor material may be polyvinyl alcohol (PVA). In other embodiments, the template precursor material may be a curable polymer, such as an elastomer.

At 404, the template precursor 454 may be cured to form a pattern template 456. The pattern template 456 will generally be a flexible solid material. The curing process may comprise heating, drying, or UV treating the template precursor 454. After curing, the pattern template 456 will preferably have enough mechanical strength to be disengaged from the master substrate 452 without damaging or permanently distorting the pattern template 456. For example, liquid polyvinyl alcohol may be applied to a master substrate to a thickness of between about 10 nm and about 1,000 nm, such as between about 50 nm and about 200 nm, for example about 100 nm, by spin-coating, die-coating, or extrusion-coating, and then cured at a temperature between about 50° C. and about 300° C., such as about 100° C., for about 1 to 5 minutes to solidify.

At 406, the pattern template 456 is detached from the master substrate 452, and is coated with a resist material 458. The resist material 458 may be applied to the pattern template 456 as a liquid or a gas using any suitable process, such as spin coating, die coating, ink jet printing, or vapor deposition. The resist material 458 is applied to form a smooth layer over the pattern template 456. The resist layer is generally thin, such as between about 10 nm and about 100 nm, for example about 60 nm, thick.

At 408, the pattern template 456 with the resist coating 458 is applied to a magnetically susceptible layer 466 of a substrate 460 to be magnetically patterned. This is usually done through a process of physical contact between the resist coating 458 and the magnetically susceptible layer 466, and may require a precision alignment process. In some embodiments, a precision alignment is accomplished through visual or automated alignment of marks on the substrate 460, or device holding the substrate, and the pattern template 456. An optional curing process may be employed after physical contact is made between the resist coating 458 and the magnetically susceptible layer 466, and may comprise heating, drying, or exposure to electromagnetic energy. The curing process may facilitate the resist coating 458 adhering to the magnetically susceptible layer 466 with more force than it adheres to the pattern template 456.

At 410 the pattern template 456 is detached from the resist coating 458, leaving the resist coating 458, with pattern acquired from the pattern template 456, adhered to the substrate 460. At 412, the pattern is developed by removing a portion of the resist coating 458, exposing the magnetically susceptible layer 466 underneath. In alternate embodiments, the resist coating may be used as applied without exposing any underlying surface, because subsequent processing may be configured to penetrate the thinner portions of the resist layer while being successfully obstructed by the thicker portions of the resist layer. Thus, removing a portion of the resist coating 458 at 412 is optional. In most embodiments, the resist layer will generally be between about 30 nm and about 100 nm thick, such as between about 50 nm and about 70 nm thick. In many embodiments, the resist layer will have thick and thin portions, the thin portions calibrated to admit incident energy or particles, and the thick portions calibrated to block incident energy or particles. The thick portions therefore mask areas of the substrate surface they cover, whereas the thin portions expose areas they cover. In some embodiments, the resist layer will have thick portions having a first thickness and thin portions having a second thickness, wherein a ratio of the first thickness to the second thickness is between about 1.3 and about 1.8, or between about 1.4 and about 1.7, such as between about 1.5 and about 1.6

At 414, energy 462 is applied to the substrate 460 as described above in connection with FIGS. 1A-1D to modify the magnetic properties of unmasked portions 464 of the magnetically susceptible layer 466. Although the energy 462 is shown modifying the unmasked portions 464 through the entire thickness of the magnetically susceptible layer 466, it may be advantageous in some embodiments to modify only a portion of the layer near the surface of the magnetically susceptible layer 466. For example, deeper modification may be expected to lead to sharper differentiation of magnetic properties between the domains. Additionally, however, modification of properties may not proceed directly perpendicular to the surface of the layer 466. As energy 462 impinges on the surface of the layer 466, its effects may travel laterally through the layer 466 to some extent, modifying the magnetic properties of domains not directly below the locus of impingement. This lateral spreading will degrade magnetic properties at the margins of the masked portions, reducing clarity of boundaries between the domains. For this reason, the desired depth of modification depends on the ratio of layer thickness to width or dimension of the unmasked portion being modified. At higher ratios of film thickness to width of unmasked portion, the desired depth of modification as a fraction of the total film thickness will be smaller.

After patterning at 414, the resist material is removed at 416, leaving the substrate with magnetically susceptible layer 466 having a pattern of magnetic properties. The resist material may be removed by etching with a chemistry that does not react with the underlying magnetic materials, such as a dry cleaning or ashing process, or by dissolving in a liquid solvent such as DMSO. In one example, Due to the absence of permanent deposition on, or etching of, the magnetically susceptible layer 466, its topography after patterning is substantially identical to its topography before patterning.

Figure 5:
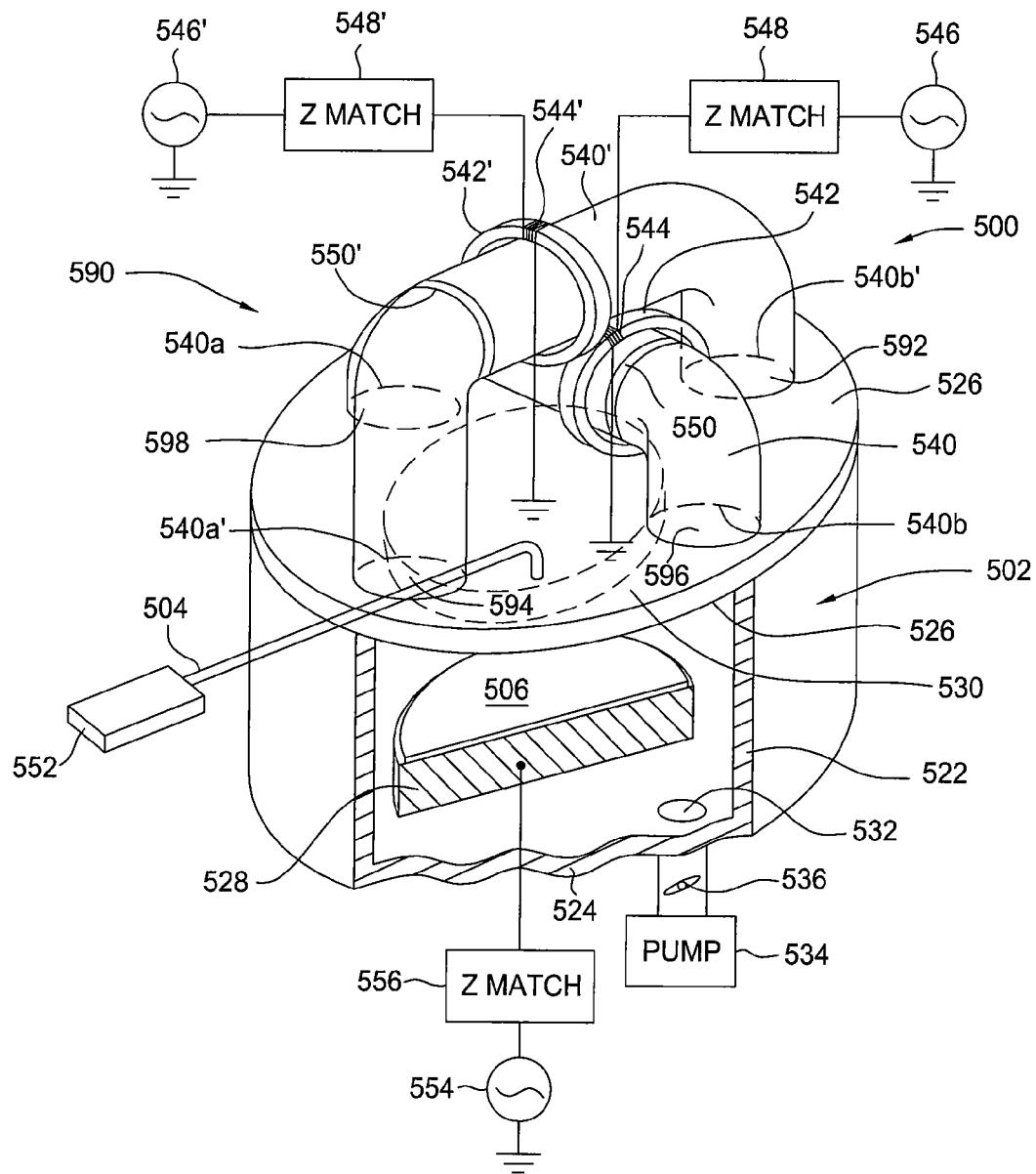
FIG. 5 is an isometric cutaway view of a substrate processing chamber according to an embodiment.

FIG. 5 is an isometric drawing of a chamber useful for embodiments of the invention. The chamber of FIG. 5 is useful for performing ion implantation procedures, but may also be used to shower a substrate with energetic ions without implanting. The processing chamber 500 includes a chamber body 502 having a bottom 524, a top 526, and side walls 522 enclosing a process region 504. A substrate support assembly 528 is supported from the bottom 524 of the chamber body 502 and is adapted to receive a substrate 506 for processing. A gas distribution plate 530 is coupled to the top 526 of the chamber body 502 facing the substrate support assembly 528. A pumping port 532 is defined in the chamber body 502 and coupled to a vacuum pump 534. The vacuum pump 534 is coupled through a throttle valve 536 to the pumping port 532. A process gas source 552 is coupled to the gas distribution plate 530 to supply gaseous precursor compounds for processes performed on the substrate 506.

The chamber 500 depicted in FIG. 5 further includes a plasma source 590. The plasma source 590 includes a pair of separate external reentrant conduits 540, 540' mounted on the outside of the top 526 of the chamber body 502 disposed transverse to one another or orthogonal to one another. The first external conduit 540 has a first end 540a coupled through an opening 598 formed in the top 526 into a first side of the process region 504 in the chamber body 502. A second end 540b has an opening 596 coupled into a second side of the process region 504. The second external reentrant conduit 540b has a first end 540a' having an opening 594 coupled into a third side of the process region 504 and a second end 540b' having an opening 592 into a fourth side of the process region 504. In one embodiment, the first and second external reentrant conduits 540, 540' are configured to be orthogonal to one another, thereby providing the two ends 540a, 540a', 540b, 540b' of each external reentrant conduits 540, 540' disposed at about 90 degree intervals around the periphery of the top 526 of the chamber body 502. The orthogonal configuration of the external reentrant conduits 540, 540' allows a plasma source distributed uniformly across the process region 504. It is contemplated that the first and second external reentrant conduits 540, 540' may have other configurations utilized to control plasma distribution in the process region 504.

Magnetically permeable torroidal cores 542, 542' surround a portion of a corresponding one of the external reentrant conduits 540, 540'. The conductive coils 544, 544' are coupled to respective RF power sources 546, 546' through respective impedance match circuits or elements 548, 548'. Each external reentrant conduits 540, 540' is a hollow conductive tube interrupted by an insulating annular ring 550, 550' respectively that interrupts an otherwise continuous electrical path between the two ends 540a, 540b (and 540a', 504b') of the respective external reentrant conduits 540, 540'. Ion energy at the substrate surface is controlled by an RF bias generator 554 coupled to the substrate support assembly 528 through an impedance match circuit or element 556.

Process gases including gaseous compounds supplied from the process gas source 552 are introduced through the overhead gas distribution plate 530 into the process region 504. RF power source 546 is coupled from the power applicators, i.e., core and coil, 542, 544 to gases supplied in the conduit 540, which creates a circulating plasma current in a first closed torroidal path power source 546' may be coupled from the other power applicators, i.e., core and coil, 542', 544' to gases in the second conduit 540', which creates a circulating plasma current in a second closed torroidal path transverse (e.g., orthogonal) to the first torroidal path. The second torroidal path includes the second external reentrant conduit 540' and the process region 504. The plasma currents in each of the paths oscillate (e.g., reverse direction) at the frequencies of the respective RF power sources 546, 546', which may be the same or slightly offset from one another.

In operation, a process gas is provided to the chamber from the process gas source 552. Depending on the embodiment, the process gas may comprise inert or reactive gases to be ionized and directed toward the substrate 506. Virtually any gas that may be easily ionized can be used in the chamber 500 to practice embodiments of the invention. Some inert gases that may be used include helium, argon, neon, krypton, and xenon. Reactive or reactable gases that may be used include borane and its oligomers, such as diborane, phosphine and its oligomers, arsine, nitrogen containing gases, hydrogen containing gases, oxygen containing gases, carbon containing gases, and combinations thereof. In some embodiments, nitrogen gas, hydrogen gas, oxygen gas, and combinations thereof may be used. In other embodiments, ammonia and its derivatives, analogues, and homologues, may be used, or hydrocarbons such as methane or ethane may be used. In still other embodiments, halogen containing gases, such as fluorine or chlorine containing gases like $BF_3$, may be used. Any substance that may be readily vaporized, and that does not deposit a material substantially identical to the magnetically susceptible layer of the substrate, may be used to modify its magnetic properties through bombardment or implantation. Most hydrides may be used, such as silane, borane, phosphine, methane, and other hydrides. Also, carbon dioxide and carbon monoxide may be used.

The power of each RF power source 546, 546' is operated so that their combined effect efficiently dissociates the process gases supplied from the process gas source 552 and produces a desired ion flux at the surface of the substrate 506. The power of the RF bias generator 554 is controlled at a selected level at which the ion energy dissociated from the process gases may be accelerated toward the substrate surface and implanted at a desired depth below the top surface of the substrate 506 in a desired ion concentration. For example, with relatively low RF power, such as less than about 50 eV, relatively low plasma ion energy may be obtained. Dissociated ions with low ion energy may be implanted at a shallow depth between about 1 Å and about 100 Å from the substrate surface. Alternatively, dissociated ions with high ion energy provided and generated from high RF power, such as higher than about 50 eV, may be implanted into the substrate having a depth substantially over 100 Å depth from the substrate surface.

Whereas disrupting the alignment of atomic spins in selected portions of the magnetic layer is desired, ion implant with relatively high energy, such as between about 200 eV and about 5 keV, or between about 500 eV and about 4.8 keV, such as between about 2 keV and about 4 keV, for example about 3.5 keV, may be useful. The combination of the controlled RF plasma source power and RF plasma bias power dissociates electrons and ions in the gas mixture, imparts a desired momentum to the ions, and generates a desired ion distribution in the processing chamber 500. The ions are biased and driven toward the substrate surface, thereby implanting ions into the substrate in a desired ion concentration, distribution and depth from the substrate surface. In some embodiments, ions may be implanted at a concentration between about $10^{15}$ cm$^{-3}$ and about $10^{20}$ cm$^{-3}$ at a depth ranging from about 2 nm to about 100 nm, depending on the thickness of the magnetic layer.

Implanting ions deeply in the magnetic layer effects the most change to the magnetic properties of the implanted area. A shallow implant, such as 2-10 nm in a 100 nm thick layer will leave a significant portion of the layer beneath the implanted area with atomic spins in alignment. Such a shallow implant with ions having energy between about 200 eV and about 1,000 eV will cause a partial change to the magnetic properties. Thus, the degree of change imposed may be selected by tuning the depth of the implant. The size of ion implanted will also affect the energy needed to implant to a given depth. For example, helium ions implanted into a magnetic material at an average energy of about 200 eV will demagnetize the magnetic material by about 20% to about 50%, and argon ions implanted at an average energy of about 1,000 eV will demagnetize by about 50% to about 80%.

Figure 6A:
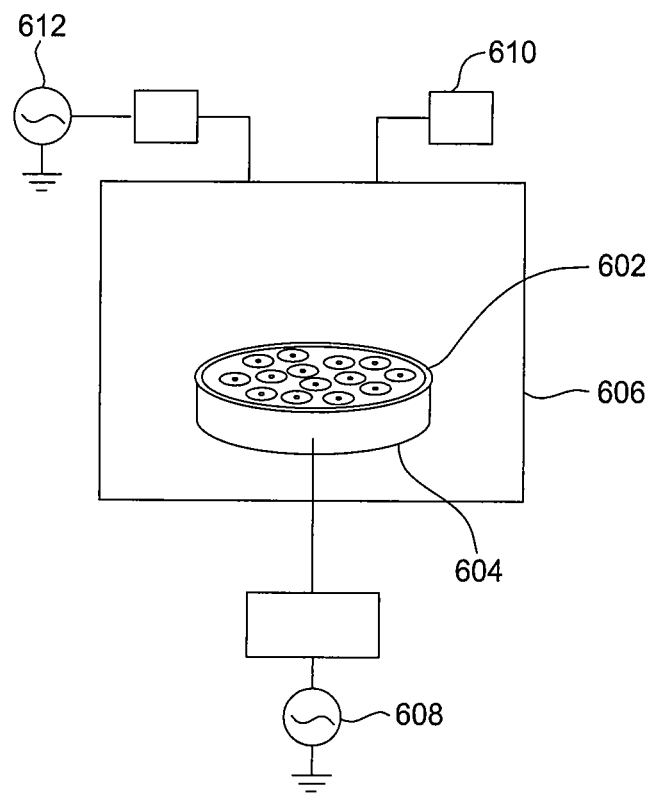
FIGS. 6A-6C are schematic side views showing different embodiments of substrate processing chambers with substrate supports having multiple substrate locations.
Figure 6B:
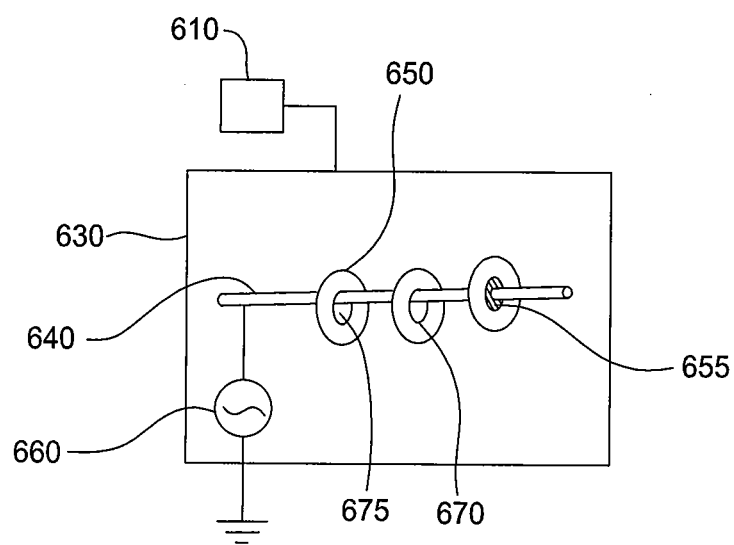
Figure 6C:
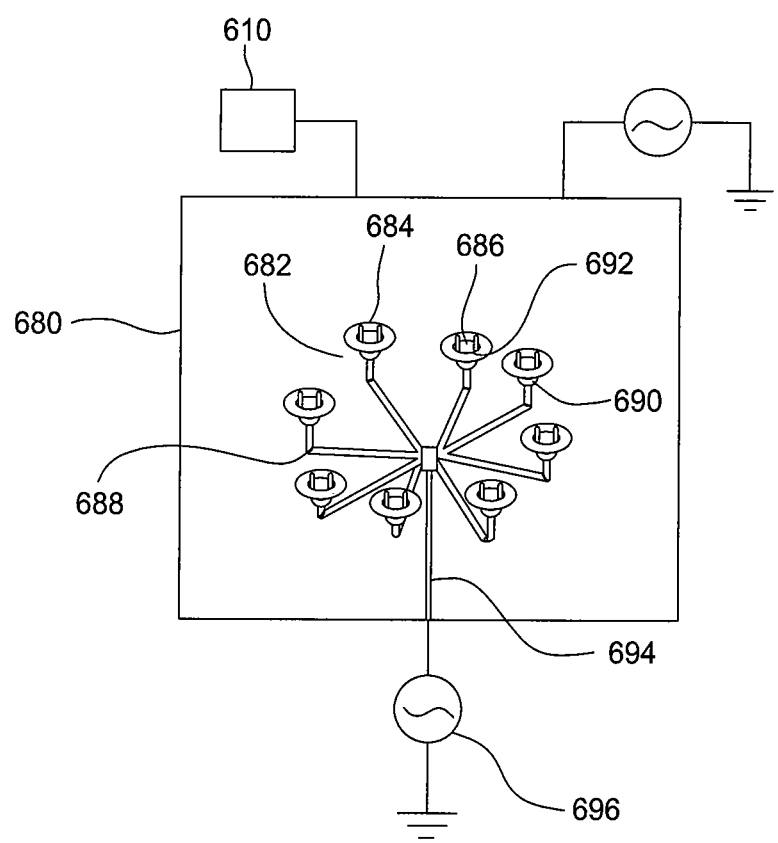

Embodiments of the invention provide for processing multiple substrates in a chamber simultaneously. FIGS. 6A-6C are schematic perspective views of process chambers having different embodiments of multiple substrate supports. In FIG. 6A, a substrate carrier 602 disposed on a substrate support 604 in a chamber 606 has a plurality of substrate locations. The chamber 606 comprises one or more process gas sources 610 and one or more bias generators 608 and 612. In some embodiments, a substrate carrier such as the substrate carrier 602 may carry from 2 to 20 substrates for simultaneous processing in a chamber. Such a substrate carrier may be useful for any of the embodiments disclosed herein requiring use of a process chamber.

The substrate carrier of FIG. 6A may be moved in and out of the process chamber 606 carrying the plurality of substrates by using a substrate handler such as that described above in connection with FIGS. 3A-3D. Referring back to FIGS. 3A and 3B, for example, the substrate handler 308 may move individual substrates from the holder 302 to a carrier such as the carrier 602 of FIG. 6A, and then move the carrier 602 into one of the process chambers 306A or 306B. If processing is required on more than one major surface of one or more of the substrates, the substrate handler 308 may retrieve individual substrates from the carrier 602 and flip them over as described above, replacing them on the carrier 602. A substrate handler such as that described in connection with FIG. 3A may contact an individual substrate at an outer edge of the substrate on opposite sides thereof, with the fingers 330 substantially parallel to the plane defined by the substrate surface, rotate the substrate 180° about an axis parallel to a diameter of the substrate, and replace the substrate on the holder.

If an electrical bias is to be applied to the substrates, use of an electrically conductive material for the substrate holder 602 will facilitate such processing. A bias generator such as generator 608 of FIG. 6A may be coupled to the substrate support, and the substrate holder 602 will transmit the electric field to the substrates, provided the substrate holder 602 is made of electrically conductive material. Alternately, a bias generator such as generator 612 may be coupled to a lid of the chamber or a gas distributor above the substrate holder.

The chamber 630 of FIG. 6B comprises an alternative embodiment of a substrate holder 640 for holding one or more substrates 650 having openings 675. The substrate holder 650 contacts each substrate 650 at an edge 670 of each opening 675. If an electrical bias is to be applied to the substrates 650, a bias generator 660 may be connected between the substrate holder 640, which may be a rod in some embodiments, and the wall of the chamber 630, which is grounded. In general for all embodiments, if RF power is to be used, an impedance matching device may be included to prevent power reflection. Alternately, a DC bias generator may be used. The substrate holder 640 may be coated with graphite or silicon to protect it from undesirable plasma effects. Furthermore, making the substrate holder 640 and its surface highly conductive will facilitate a good electrical contact between it and the substrates 650. The substrates 650 can be fixed in place using clamps 655 or other convenient means; the clamps 655 will not only fix the substrates 650 in place but also ensure a good electrical connection between the substrates 650 and the substrate holder 640. The substrate holder 640 is configured to carry many substrates 650 (only three are shown for ease of illustration). Furthermore, the chamber 630 can be configured to use more than one substrate holder 640, each substrate holder 640 loaded with one or more substrates 650 for simultaneous processing.

The substrate holders 640 are generally moved into and out of the chamber 630 to facilitate loading and unloading of substrates 650. Loading and unloading of substrates 650 may be accomplished by any convenient means. In one embodiment, the substrate holders 640 may be extracted from the chamber 630 through an opening in the wall of the chamber, and a robot having an extension such as the extension of FIG. 3C may remove substrates 650 from the holders 640 individually. In another embodiment, the holders 640 may deposit the substrates 650 into a holding rack (not shown), and the holders 640 may then be withdrawn from the openings 675. A holding rack for receiving substrates in this manner may also serve as a shelf for staging the substrates 650 for further processing.

The chamber 680 in FIG. 6C comprises another embodiment of a substrate holder 682 for processing one or more substrates 684 having openings 686. The substrate holder 682 comprises a frame 688 upon which the substrates 684 are mounted. In the embodiment of FIG. 6C, the substrates 684 are mounted on the frame 688 by virtue of extensions 690, which may be substantially similar to the extension of FIG. 6D. The extensions 690 contact an edge 692 of each opening 686 in at least two locations to generate a frictional holding force on each substrate 684. The substrate holder 682 of FIG. 6C enables simultaneous processing of two major surfaces of each substrate 684 by exposing the two major surfaces, such as the front and back sides, to the processing environment. A substrate holder similar to the substrate holder 682 of FIG. 6C may be useful in processes involving exposure of substrates to non-directional processing environments, such as processes involving exposure to ambient process gases or plasmas or to ambient energy within the chamber. Examples of processes in which a substrate holder of this sort may be useful include, but are not limited to, ion implant processes, CVD processes, plasma processes, and thermal processes involving non-directional thermal energy, such as a furnace-type heating process. A substrate holder similar to the substrate holder 682 of FIG. 6C may be useful in processes involving directional processing environments if an additional mechanism is employed to orient the frame 688. For example, the frame 688 may be mounted on a rotator (not shown) that would facilitate rotating the frame 688. Mounting the frame on a rotator would facilitate flipping the substrates 684 mounted on the frame 688 to expose two major surfaces of each substrate 684 to a directional processing environment. In some embodiments, the frame 688 may be portable, detaching from a base 694 that couples the frame to external power sources such as an RF power source 696. A detachable frame 688 may be removed from the chamber 680 and transported elsewhere for further processing of the substrates 684.

Figure 7:
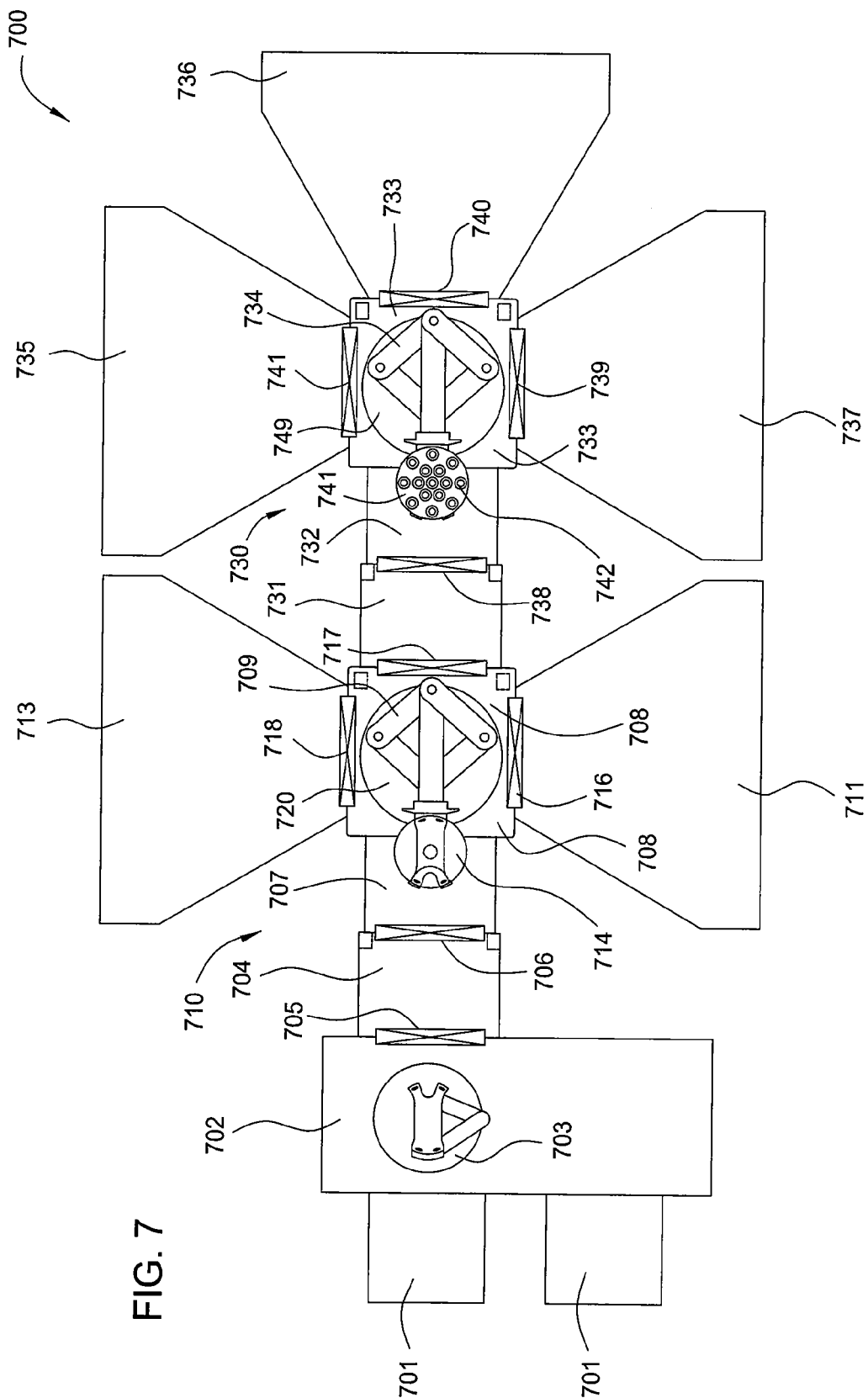
FIG. 7 is a plan view of a substrate processing apparatus according to one embodiment.

FIG. 7 schematically illustrates a plan view of a cluster tool 700 in accordance with one embodiment of the present invention. The cluster tool 700 comprises multiple processing chambers coupled to a mainframe comprising two transfer chambers 708 and 733.

The cluster tool 700 comprises a front-end environment 702 in selective communication with a load lock chamber 704. One or more pods 701 are coupled to the front-end environment 702. The one or more pods 701 are configured to store substrates. A factory interface robot 703 is disposed in the front-end environment 702. The factory interface robot 703 is configured to transfer substrates between the pods 701 and the load lock chamber 704.

The load lock chamber 704 provides a vacuum interface between the front-end environment 702 and a first transfer chamber assembly 710. An internal region of the first transfer chamber assembly 710 is typically maintained at a vacuum condition and provides an intermediate region in which to shuttle substrates from one chamber to another and/or to a load lock chamber.

In one embodiment, the first transfer chamber assembly 710 is divided into two parts. In one embodiment of the present invention, the first transfer chamber assembly 710 comprises a transfer chamber 708 and a vacuum extension chamber 707. The transfer chamber 708 and the vacuum extension chamber 707 are coupled together and in fluid communication with one another. An inner volume of the first transfer chamber assembly 710 is typically maintained at low pressure or vacuum condition during process. The load lock chamber 704 may be connected to the front-end environment 702 and the vacuum extension chamber 707 via slit valves 705 and 706 respectively.

In one embodiment, the transfer chamber 708 may be a polygonal structure having a plurality of sidewalls, a bottom and a lid. The plurality of sidewalls may have openings formed therethrough and are configured to connect with processing chambers, vacuum extension and/or pass through chambers. The transfer chamber 708 shown in FIG. 7 has a square or rectangular shape and is coupled to processing chambers 711, 713, a pass through chamber 731 and the vacuum extension chamber 707. The transfer chamber 708 may be in selective communication with the processing chambers 711, 713, and the pass through chamber 731 via slit valves 716, 718, and 717 respectively.

In one embodiment, a central robot 709 may be mounted in the transfer chamber 708 at a robot port formed on the bottom of the transfer chamber 708. The central robot 709 is disposed in an internal volume 720 of the transfer chamber 708 and is configured to shuttle substrates 714 or substrate carriers 741 among the processing chambers 711, 713, the pass through chamber 731, and the load lock chamber 704. In one embodiment, the central robot 709 may include two blades for holding substrates, each blade mounted on an independently controllable robot arm mounted on the same robot base. In another embodiment, the central robot 709 may have the capacity for vertically moving the blades.

The vacuum extension chamber 707 is configured to provide an interface to a vacuum system to the first transfer chamber assembly 710. In one embodiment, the vacuum extension chamber 707 comprises a bottom, a lid and sidewalls. A pressure modification port may be formed on the bottom of the vacuum extension chamber 707 and is configured to adapt to a vacuuming pump system. Openings are formed on the sidewalls so that the vacuum extension chamber 707 is in fluid communication with the transfer chamber 708, and in selective communication with the load lock chamber 704.

In one embodiment, the vacuum extension chamber 707 comprises a shelf (not shown) configured to store one or more substrates or substrate holders 714. Processing chambers directly or indirectly connected to the transfer chamber 708 may store their substrates or substrate holders on the shelf and use the central robot 709 to transfer them.

The cluster tool 700 further comprises a second transfer chamber assembly 730 connected to the first transfer chamber assembly 710 by the pass through chamber 731. In one embodiment, the pass through chamber 731, similar to a load lock chamber, is configured to provide an interface between two processing environments. In this case, the pass through chamber 731 provides a vacuum interface between the first transfer chamber assembly 710 and the second transfer chamber assembly 730.

In one embodiment, the second transfer chamber assembly 730 is divided into two parts to minimize the footprint of the cluster tool 700. In one embodiment of the present invention, the second transfer chamber assembly 730 comprises a transfer chamber 733 and a vacuum extension chamber 732 in fluid communication with one another. An inner volume of the second transfer chamber assembly 730 is typically maintained at low pressure or vacuum condition during processing. The pass through chamber 731 may be connected to the transfer chamber 708 and the vacuum extension chamber 732 via slit valves 717 and 738 respectively so that the pressure within the transfer chamber 708 may be maintained at different vacuum levels.

In one embodiment, the transfer chamber 733 may be a polygonal structure having a plurality of sidewalls, a bottom and a lid. The plurality of sidewalls may have openings formed therein and are configured to connect with processing chambers, vacuum extension and/or pass through chambers. The transfer chamber 733 shown in FIG. 7 has a square or rectangular shape and is coupled with processing chambers 735, 736, 737, and the vacuum extension chamber 732. The transfer chamber 733 may be in selective communication with the processing chambers 735, 736, via slit valves 741, 740, 739 respectively.

A central robot 734 is mounted in the transfer chamber 733 at a robot port formed on the bottom of the transfer chamber 733. The central robot 734 is disposed in an internal volume 749 of the transfer chamber 733 and is configured to shuttle substrates 714 or substrate carriers 741 among the processing chambers 735, 736, 737, and the pass through chamber 731. In one embodiment, the central robot 734 may include two blades for holding substrates, each blade mounted on an independently controllable robot arm mounted on the same robot base. In another embodiment, the central robot 734 may have the capacity for moving the blades vertically.

In one embodiment, the vacuum extension chamber 732 is configured to provide an interface between a vacuum system and the second transfer chamber assembly 730. In one embodiment, the vacuum extension chamber 732 comprises a bottom, a lid and sidewalls. A pressure modification port may be formed on the bottom of the vacuum extension chamber 732 and is configured to adapt to a vacuum system. Openings are formed through the sidewalls so that the vacuum extension chamber 732 is in fluid communication with the transfer chamber 733, and in selective communication with the pass through chamber 731.

In one embodiment of the present invention, the vacuum extension chamber 732 includes a shelf (not shown), similar to that described in connection with the vacuum extension chamber 707 above. Processing chambers directly or indirectly connected to the transfer chamber 733 may store substrates or substrate holders on the shelf.

In one embodiment, the cluster tool 700 may be configured to perform a hard disk drive substrate manufacturing process. The processing chamber 711 may be a pre-clean chamber configured to perform a cleaning process prior to a PVD process. The process chamber 713 may be a PVD chamber configured to deposit a thin film of magnetic material on one or more substrates, wherein a plurality of substrates may be processed simultaneously. The PVD chamber 713 may be configured to deposit a soft-magnetic film, and a magnetic film over the soft magnetic film, by two different PVD processes in the same chamber. The processing chambers 735, 736, 737 may be adapted to pattern, treat, and coat the hard disk drive substrates. For example, in one embodiment the processing chamber 735 may be a physical imprint chamber, the chamber 736 may be an ion implant and resist stripping chamber, and the chamber 737 may be a coating chamber that coats the substrate by a CVD or PECVD process.

A substrate carrier such as the carrier 741 may be used with any processing architecture to enable processing of multiple substrates such as the substrates 742 simultaneously. In one embodiment, the substrate carrier may be a thin sheet of a substantially rigid material capable of withstanding the processing environments created by the processes described herein. The carrier may be a glass or silicon platter in some embodiments. In other embodiments, the carrier may be ceramic or a composite material, such as carbon composite. In some embodiments, the carrier may be a platter coated with a process-resistant material, such as a glass-coated or ceramic-coated platter. The carrier may be a 300 mm substrate commonly used in semiconductor manufacturing processes. In some embodiments, the carrier may be shaped to facilitate substrate processing and handling. For example, the carrier may have raised or lowered portions to facilitate manipulating individual substrates disposed on the carrier. In one embodiment, each substrate site on the carrier may have a trench formed around the site to allow a robot with gripping extensions to contact an edge of a substrate disposed on the site. In another embodiment, the carrier may have a depression formed at the center of the substrate site to allow a robot with gripping extensions to contact an inner edge of the substrate having a central opening. In some embodiments, the substrate sites on the carrier may be depressed to prevent substrates from moving on the carrier as the carrier is transported.

Typically, substrates are processed in a sealed chamber having a pedestal for supporting a substrate disposed thereon. The pedestal may include a substrate support that has electrodes disposed therein to electrostatically hold the substrate against the substrate support during processing. For processes tolerant of higher chamber pressures, the pedestal may alternately include a substrate support having openings in communication with a vacuum source for securely holding a substrate or substrate holder against the substrate support during processing.

Processes that may be performed in any of the chambers 711, 713, 735, 736, or 737, include deposition, implant, and thermal treatment processes, among others. In one embodiment, a chamber such as any of the chambers 711, 713, 735, 736, or 737, is configured to perform a sputtering process on a substrate, or on multiple substrate simultaneously. The sputtering process may be used to deposit any of the magnetic layers discussed herein. A target, generally comprised of a material to be deposited on the substrate, is supported above the substrate, typically fastened to a top of the chamber. A plasma formed from a gas, such as argon, is supplied between the substrate and the target. The target is biased, causing ions within the plasma to be accelerated toward the target. Ions impacting the target cause material to become dislodged from the target. The dislodged material is attracted towards the substrate and deposit a film of material thereon. A second chamber additionally be configured to perform a modification process as described elsewhere herein to modify the magnetic properties of the magnetic layers deposited in an adjacent chamber. A third chamber may be configured to deposit one or more of the protective layer or the lubrication layer by a chemical vapor deposition process that may be plasma-enhanced.

In another embodiment, the magnetic layers may be deposited in a separate tool, and the substrates then transferred to a cluster tool such as that shown in FIG. 7 for masking in one chamber, surface modification in a second chamber, and deposition of protective and lubricant layers in the third chamber.

If the chamber is configured to process multiple substrates on a substrate holder, as shown in FIG. 7, the substrates may be processed on two major surfaces by flipping. In one embodiment, flipping of multiple substrates disposed on a first substrate holder may be performed by covering the substrates with a second substrate holder substantially identical to, and properly aligned with, the first substrate holder to form a substrate flipping assembly. A bladed robot may securely grasp the substrate flipping assembly, rotate the substrate flipping assembly 180° about a diameter axis of the substrate flipping assembly, and then remove the first substrate holder, leaving the substrates disposed on the second substrate holder having been turned over to expose the previously hidden major surface of each substrate. In another embodiment, a robot blade such as that illustrated in FIG. 3C may be used to grasp each substrate at an outer edge of the substrate, with the fingers 330 extending in a direction substantially coplanar with the plane formed by the substrate. The substrate may be flipped by rotating 180° about an axis defined by a diameter of the substrate.

In one embodiment one or more of the central robots 709 and 734 may be configured to flip individual substrates or substrate holders. The robots may be fitted with substrate handling extensions such as those described in connection with FIGS. 3C and 3D, and the extensions may be rotatably attached to their respective robot arms to facilitate rotating substrates about their diameters. Additionally, the robots may be fitted with extensions designed to apply a compressive force to two substrate carriers having substrates disposed therein, and flip the substrate carriers together to flip all the substrates disposed therein at the same time.

Figure 8:
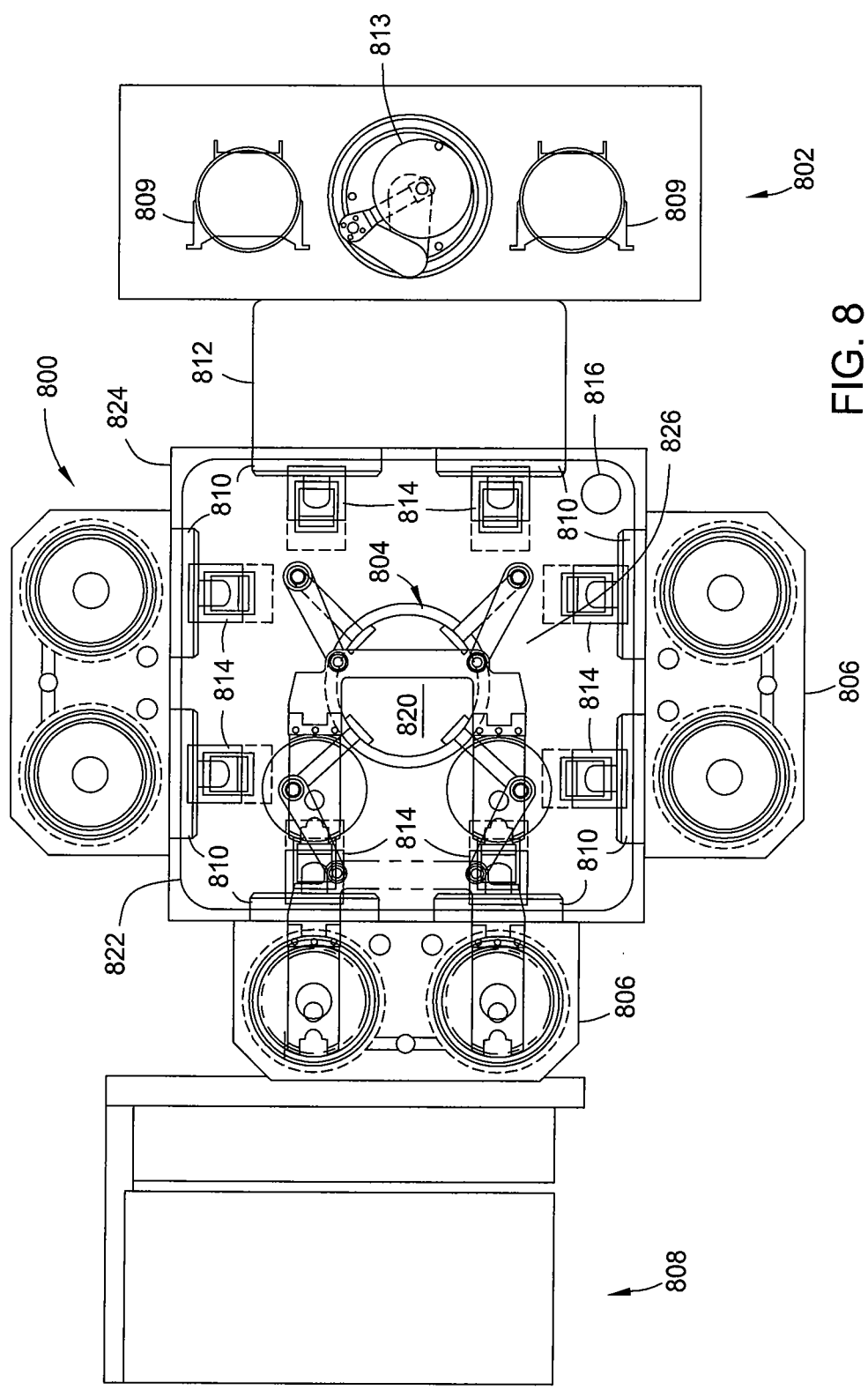
FIG. 8 is a plan view of a substrate processing apparatus according to another embodiment.

FIG. 8 is a top view of a multi-chamber processing system 800 according to one embodiment. The processing system includes a transfer chamber 824 with side walls 822 preferably machined or otherwise fabricated from one piece of material, such as aluminum. A lid (not shown) is supported on the sidewalls 822 during operation to form a vacuum enclosure. The sidewalls 822 of transfer chamber 824 support processing chambers 806 and loadlock chamber 812. The sidewalls 822 define at least two passages 810 on each side through which access to the other chambers on the system is provided. Each of the processing chambers 806 and loadlock chamber 812 include one or more slit valve openings and slit valves which enable communication between the processing chambers 806, the loadlock chamber 812 and the transfer chamber 824 while also providing vacuum isolation of the environments within each of these chambers to enable a staged vacuum within the system. The bottom 826 of the transfer chamber 824 defines a central passage (not shown) in which a substrate handler 820, such as a robot assembly, extends and is mounted to the bottom of the transfer chamber 824. In addition, the bottom 826 defines a plurality of passages 814 through which one or more slit valve actuators (not shown) extend and are sealably mounted. A gas purge port 816 is disposed through the bottom 826 of the transfer chamber 824 to provide a purge gas during pump down.

The processing system 800 includes a front-end staging area 802 where receptacles 809 are supported for handling substrates or substrate holders. A substrate handler 813 retrieves substrates or substrate holders from the receptacles 809 and loads them into the load lock chamber 812. The load lock chamber 812 is used to facilitate entry and exit of substrates to and from the transfer chamber 824 through two of the passages 814 in the transfer chamber sidewall 822. A back end unit 808 provides utility support for the processing system 800, such as power generators, power distribution, and gas distribution.

The processing system 800 supports a plurality of substrate processing chambers 806 coupled to the sidewalls 822 of the transfer chamber 824. Each processing chamber may be configured to perform one of a number of substrate processing operations, such as patterning, implanting, deposition by sputtering, and deposition by chemical vapor deposition, which may be plasma-enhanced, as well as other substrate processes including cleaning and orientation. In some embodiments, at least one of the chambers 806 is configured as an ion bombardment chamber such as the chamber of FIG. 5.

In one embodiment, the processing system 800 includes one or more physical vapor deposition chambers configured to deposit layers having desired magnetic properties. Such chambers may be configured as sputtering chambers, with a substrate support and a sputtering target located above the substrate support. All magnetic layers may be deposited in one chamber, or a chamber may be devoted to each material being deposited as a magnetic layer. For example, a soft magnetic layer may be deposited in a first chamber 806, and the magnetic recording layer deposited in a second chamber 806.

The substrate handler 820 of FIG. 8 is a coupled tandem robot operable to deposit and retrieve one substrate or substrate holder from each of a tandem pair of process chambers 806, or the tandem load lock chamber 812, simultaneously. In an alternate embodiment, a pair of uncoupled single handlers may be substituted for the coupled tandem handler 820 to enable independent operation of two chambers 806 in a tandem pair. Such uncoupled handlers would enable retrieving a substrate or substrate holder from one chamber 806 of a tandem pair and depositing the substrate or substrate holder into the other chamber 806 of the same tandem pair. Additionally, such uncoupled single handlers may be configured with the apparatus of FIG. 3C or 3D to enable manipulation of a single substrate among a plurality of substrates disposed on a substrate carrier in the processing system 800. Also, each uncoupled single handler may be configured to rotate each substrate or substrate carrier about a diameter of the substrate or substrate carrier, as described herein.

In one embodiment, the processing system 800 includes one or more physical patterning chambers configured to create a patterned mask on one or more substrates by a physical pattern transfer or imprint process. A patterned template may be provided to a first chamber 806 to be coated with a resist material, and the patterned template may be applied to one or more substrates to transfer the patterned resist, and then dissolved, in a second chamber 806.

Other types of chambers 806 that may be included in the processing system 800 are flipping chambers, in which a substrate holder carrying a plurality of substrates may be flipped by any of the techniques described herein, chemical vapor deposition chambers for depositing protective and lubricating layers on substrates following a magnetic patterning process, wet clean chambers, and thermal treatment chambers.

In one embodiment, a processing system such as the processing system 800 is provided having a plurality of groups of chambers. A first group of chambers may be configured for forming one or more layers having magnetic properties on one or more substrates carried on a substrate carrier. The first group of chambers may be sputtering chambers, for example. A second group of chambers may be configured for applying a patterned resist layer to the substrates carried on the substrate carrier. The second group of chambers may include a chamber configured to apply a resist material to a patterned template and a chamber for applying the coated template to the one or more substrates. A third group of chambers may be configured for changing the magnetic properties of the substrates having the patterned resist material applied thereto, removing the resist, and coating the substrate. The third group of chambers may include ion implant chambers, plasma chambers, and CVD chambers.

The configurations of FIGS. 7 and 8 allow multiple substrate processing steps to be performed without breaking vacuum or exposing substrates to air. The transfer chamber 708 of FIG. 7 and 824 of FIG. 8 may be maintained under vacuum during processing to allow transfer of substrates, potentially on substrate holders, from chamber to chamber for processing. In one embodiment, the magnetic layer or layers may be formed on the substrate in one chamber, may be patterned in another chamber, and may be exposed to particles or energy to produce the magnetic pattern in another chamber, all without breaking vacuum.

In one embodiment, a processing system such as the processing system 800 may have six processing chambers coupled thereto, with a single substrate handling robot configured to manipulate individual substrates disposed on substrate carriers, or the carriers themselves, and to flip the substrates or carriers. In one embodiment, the six processing chambers may be a wet clean chamber, a sputtering chamber, a physical imprint chamber, an ion implant chamber, a resist stripping chamber, and a CVD chamber, which may be plasma-enhanced. In such an embodiment, a substrate carrier having a plurality of substrate disposed thereon may be processed in each chamber consecutively to produce hard drive substrates as described herein. In some embodiments, the substrates may be disposed in the chambers using substrate supports that expose two major surfaces of each substrate to the processing environment simultaneously.

Figure 9A:
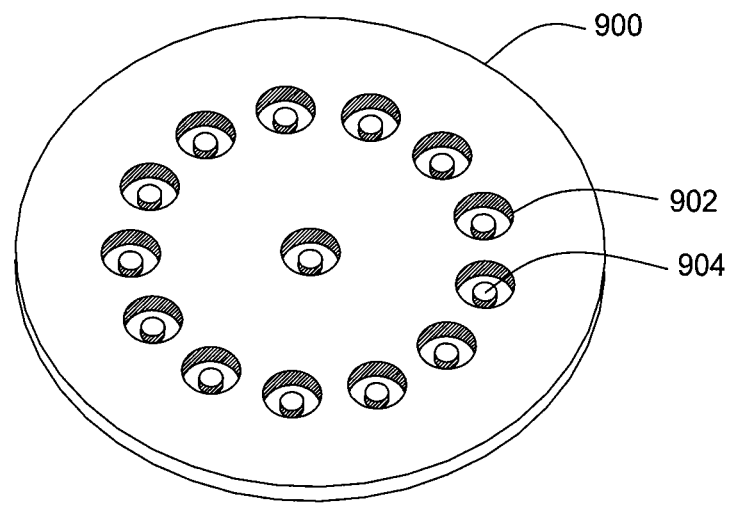
FIG. 9A is a perspective view of a substrate holder according to an embodiment.
Figure 9B:
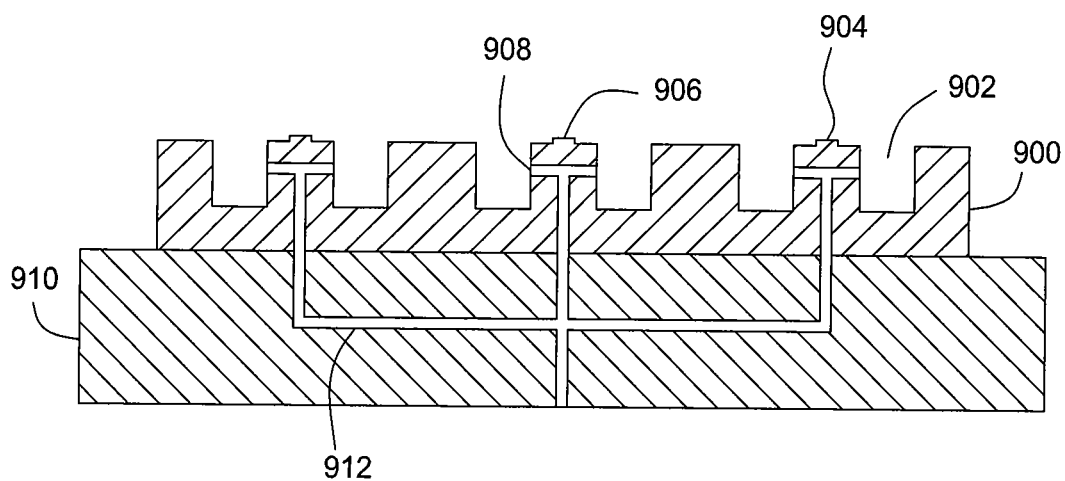
FIG. 9B is a cross-sectional view of a substrate holder on a substrate support according to another embodiment.

FIGS. 9A and 9B are schematic illustrations of a substrate carrier 900 according to an embodiment of the invention. FIG. 9A shows the substrate carrier 900 in a perspective view, and FIG. 9B shows the substrate carrier 900 coupled to a support 910. The substrate carrier 900 has a plurality of substrate sites 902 for disposing substrates thereon. In the embodiment of FIG. 9A, the substrate sites 902 are illustrated as recessed areas of the carrier 900. Each substrate site 902 has a contact portion 904 for stabilizing the substrate. The substrate will generally rest on the contact portion 904, and extend outward toward the rim of the recessed site 902, creating a cavity beneath the substrate.

FIG. 9B illustrates the carrier 900 in cross-section coupled to a support 910. The contact portion 904 has an extension 906 for mating with an opening at the center of a substrate. The carrier 900 also has a plurality of conduits 908 disposed through the contact portions 904. The conduits 908 are in fluid communication with conduits 912 similarly disposed in the support 910. The conduits 912 and 908 provide means for apply a cooling medium to the cavity beneath each substrate disposed in a substrate site 902. For processes described herein which may require cooling of substrates, a cooling gas may be provided to the back side of the substrates through the conduits 912 and 908. In one embodiment, modifying the magnetic surface of the substrates may raise their temperature to a level sufficient to degrade the resist material or threaten the integrity of the magnetic layer. In such an embodiment, the substrate may be cooled during processing by application of a cool non-reactive gas, such as helium, argon, hydrogen, or nitrogen, to the substrate.

In an alternate embodiment of a substrate carrier, the substrate sites may be projections above the otherwise flat surface of the carrier. The projections may be shaped to mate with openings in the substrates such that the substrates are held above the flat surface of the carrier. The projections may comprise conduits similar to those described above for cooling the back side of each substrate.

In the substrate carrier of FIG. 9B, the conduits 908 are illustrated as projecting gas outward from the contact portion 904 at a 90° angle from a major axis of the contact portion 904. In alternate embodiments, the conduits 908 may be fitted with nozzles to shape or direct the flow of gas in any desired way. For example, nozzles may divert the gas at an upward angle toward the substrate. In an alternate embodiment, the conduits 904 may be formed having an upward angle to direct cooling gas toward the substrate.

In another embodiment, a magnetically susceptible layer may be uniformly amorphized by ion implantation without a patterned mask. The amorphous layer may then be selectively treated with thermal or other directed energy to remagnetize domains of the magnetically susceptible layer according to a pattern. In some embodiments, portions of the magnetically susceptible layer may be recrystallized according to a pattern by treatment with the directed energy. The directed energy is patterned, and the substrate exposed to the patterned energy. In areas of the substrate exposed to the energy, atoms reorganize into a crystalline matrix, forming magnetic domains separated by non-magnetic, amorphous areas.

In one embodiment, a substrate having a magnetically susceptible layer is disposed in a processing chamber. The magnetically susceptible layer is exposed to a plasma to modify a magnetic property of the magnetically susceptible layer from a first value to a second value. Patterned energy is directed onto the magnetically susceptible layer to expose portions of the layer to energy. The pattern formed in the energy creates local variation in energy flux on the surface of the layer according to domains to be defined in the surface of the layer. The energy modifies the magnetic property from the second value to a third value, differentiating the areas exposed to the energy from areas not exposed to the energy, according to the pattern developed in the energy. In some embodiments the areas exposed to energy are at least partially recrystallized, and differ in crystal structure from the areas not exposed to the energy. In other embodiments, exposing portions of the magnetically susceptible surface to patterned energy substantially restores the magnetic property. In some embodiments, the third value of the magnetic property is not significantly different from the first value, such that following exposure to the patterned energy, the magnetically susceptible layer comprises domains with a magnetic property having a first value separated by domains wherein the magnetic property has a second value different from the first value.

Ions may be implanted partially or throughout the magnetically susceptible layer. In most embodiments, the magnetically susceptible layer will be implanted through at least about 50% of its thickness, and up to 100% of its thickness. Dosage between about $10^{15}$ and about $10^{18}$ $cm^{-2}$ is generally sufficient to substantially reduce or eliminate magnetic properties of the magnetically susceptible layer.

Patterned energy may be delivered to the substrate using electromagnetic energy, focused ions, or electron beams. Patterned electromagnetic energy may be formed using a laser field emitter array formed with emitters spaced according to a desired pattern, as is known in the art. The beam pattern produced by a field emitter array may then be focused by passing through a lens to achieve the dimension and distribution of energy desired. For example, an array of laser light emitters organized in a rectilinear array 20 cm on each side, each of which emits a laser beam of width about 1 μm and is separated from its neighbors by a distance of about 1 μm, may be focused by a factor of 20 using one or more lenses to yield an array of laser beams 1 cm on each side, each beam having dimension of about 50 nm and separated from its neighbors by a distance of about 50 nm. Depending on wavelength of the laser light, a single laser beam may be multiplexed using a diffraction grating to produce a rectilinear pattern of laser light.

In other embodiments, a field array of electron emitters may be used to emit patterned beams of electrons, as is known in the art. Similar to the laser embodiment above, a patterned array of electron beams may be focused to a desired dimension and distribution using one or more electrostatic lenses. Alternately, a single electron beam may be multiplexed using a metal foil film as a diffraction matrix.

Finally, ions may be generated in a plasma chamber having a perforated plate to produce a diffuse pattern of ion streams that may be focused using one or more electrostatic lenses.

The patterned energy produced according to the embodiments described above is directed toward the amorphized layer of the substrate. The relative position of the substrate and the patterned energy is changed to expose all areas of the substrate to be treated. For example, a first area of the substrate is exposed to the patterned energy, then a second area of the substrate is exposed to the patterned energy. The areas to be exposed are treated sequentially according to a pattern to accomplish the remagnetization. In some embodiments, multiple areas of the substrate may be treated simultaneously. For example, the quadrants of the substrate may be defined, and four separate energy sources used to direct patterned energy to four different areas of the substrate simultaneously. In still other embodiments, multiple substrates may be processed simultaneously in one chamber using methods and apparatus described herein.

In some embodiments, the patterned energy may be pulsed. In one embodiment, a laser source or field laser source, as described above, may be pulsed to generate a pulsed patterned energy. Each pulse partially remagnetizes areas of the substrate according to a pattern. An e-beam source or field e-beam source may also be pulsed. In some embodiments, the pulsed energy will be preferred because the energy associated with each pulse can be dissipated through the magnetically susceptible layer before the next pulse is delivered, avoiding accumulation and high-flux dissipation of energy through areas of the layer intended to remain untreated.

EXAMPLES

Experiments were conducted to determine ion stopping properties of resist for helium and boron ions for a given bias voltage.

Example 1

Helium Implantation

A glass substrate was sputtered with an iron-nickel alloy soft magnetic layer to a thickness of about 100 nm. A magnetic thin film layer of a cobalt-chromium-platinum alloy was sputtered on the iron-nickel alloy soft magnetic layer to a thickness of about 20 nm. The prepared sample as described above was subjected to a plasma containing helium ions, by providing helium gas into the process chamber. The process chamber pressure was about 15 mTorr, the RF bias voltage was about 2 kV, the source power was about 500 W, helium gas was provided at a flow rate of about 300 sccm and the implant time was about 25 seconds. Helium ions were found to penetrate a resist layer of thickness up to about 85 nm. Implant of helium ions in this way reduced the saturation magnetic flux density of the exposed portions from 1.36 Tesla (T) to 0.1 T. Although not used for this example, a second gas may be provided with the helium to aid in plasma formation. For example, argon gas may be provided at a flow rate of about 16 sccm in addition to the helium gas.

Following helium implantation, the sample was subjected to thermal annealing to assess the stability of the implanted layer. The thermal annealing was performed at both about 100° C. and about 200° C. for about one hour in vacuum at a pressure of about 5 Torr to about 10 Torr. Thermal annealing at 100° C. further reduced saturation flux density of the implanted areas to about 0.01 T, and thermal annealing at 200° C. further reduced saturation flux density to about 0.03 T. Thus, a thermal anneal process following magnetic alteration by ion implant further enhanced the difference in magnetic properties between the treated and untreated areas of the substrate.

Example 2

Boron Implantation

A similar sample to that used in Example 1 was subjected to boron ion implantation. The prepared sample as described above, was subjected to a plasma containing boron ions, by providing $BF_3$ gas to a process chamber containing the sample. The process chamber pressure was maintained at about 15 mTorr, the RF bias voltage was about 9 kV, the source power was about 500 W, the $BF_3$ gas was provided at a flow rate of about 300 sccm and the implant time was about 20 seconds. Boron ions were found to penetrate a resist layer up to a thickness of about 65 nm, and further penetrated the magnetic layer at constant concentration up to a depth of about 10 nm, decreasing thereafter. Argon gas may also be used in this example to supplement plasma formation, as in Example 1. The implanted boron ions reduced the saturation flux density of the sample from about 1.36 T to about 0.5 T, a reduction of over 50%.

It is evident from the above examples that the resist thickness needed to stop penetration of energized ions through the resist layer is dependent upon the species being implanted, the process parameters, and the desired penetration depth of the ions into the magnetic thin film. As the dimension of the regions selected for implantation diminishes, thickness of the resist layer also diminishes to permit effective patterning. As the resist thickness decreases, the resist layer may no longer be able to mask portions of the substrate surface effectively.

This may be overcome by adding a dopant, such as a silicon containing compound, to the resist that increases the resistance to the penetration of charged ions. Other dopants that may be used to increase the resistance to the penetration of the charged ions include compounds containing sulfur and phosphorus. In one embodiment, nano particles can be added to tune resistance to the penetration of charged ions. For example, nano particles of aluminum oxide ($Al_2O_3$), silicon dioxide ($SiO_2$), ceria ($CeO_2$) and titanium dioxide ($TiO_2$) may be used in this way.

It is evident from the above examples that different element species have different effects on the magnetic properties based upon the process parameters and the desired penetration depth of the ions into the magnetic thin film. For example, one or more elements may be advantageously used to modify the magnetic properties of the magnetic film. In one embodiment, a combination of helium and boron may provide added benefit. For example, helium with less molecular weight can penetrate deeper into the magnetic thin film and change the magnetic properties, using less bias voltage. Boron with a higher molecular weight may be used before, after, or along with the penetration of helium to further impact the magnetic properties of the magnetic thin film and also to act as a barrier for the helium ions from escaping from the magnetic thin film over time.

Although the combination of helium and boron has been described, one skilled in the art appreciates that various other permutation and combinations of elements may be used in sequence or together to derive magnetic and other properties that are favorable to the retention and enhancement of the modified magnetic properties. It is also evident from the above examples that different element species may be used to modify the magnetic properties of the magnetic thin film. For example, a compound containing elements that increase the magnetic property of the thin film, such as platinum, may be used.

Embodiments of the invention may apply to, and incorporate, various types of magnetic recording media. For, example, recording media having a granular magnetic structure may be used. Also, multi-layered magnetic thin films may be used. A magnetic thin film that is also a continuous magnetic film may be used with patterned media. The patterned media may be bit patterned media or track patterned media. In one embodiment, the magnetic thin film may be made of highly anisotropic magnetic material, suitable for a thermally assisted magnetic recording.

Substrates processed according to embodiments described herein will have a first plurality of domains having a first magnetic characteristic and a second plurality of domains having a second magnetic characteristic. The first characteristic and the second characteristic will be measurably different. For example, the first magnetic characteristic may be a non-zero magnetic susceptibility or magnetic field, while the second magnetic characteristic is substantial absence of magnetic field or susceptibility. Alternately the two magnetic characteristics may be measurably different non-zero magnetic field or susceptibility. The domains will have a dimension parallel to the surface of the substrate not more than about 50 nm, such as not more than about 25 nm. Moreover, such substrates will have measurable amounts of one or more elements from the group consisting of helium, hydrogen, oxygen, nitrogen, boron, phosphorus, arsenic, fluorine, silicon, platinum, aluminum, and argon in at least a portion of the first and the second pluralities of domains. Some substrates will have measurable amounts of one or more of the foregoing elements in only the first or second plurality of domains, but not both. Other substrates will have measurable amounts of one or more of the elements in both the first and second plurality of domains.

While the foregoing is directed to embodiments of the invention, other and further embodiments of the invention may be devised without departing from the basic scope thereof.

What is claimed is:

1. An apparatus for processing magnetic substrates, comprising:
a processing chamber;
a substrate support platter disposed in an interior of the processing chamber, the substrate support platter comprising a plurality of laterally displaced substrate locations;
means for flipping substrates to enable exposing at least two major surfaces of each substrate to a processing environment in the processing chamber; and
means for modifying the magnetic properties of the at least two major surfaces of each substrate by exposing the surfaces to plasma ion implantation in the processing chamber.

2. The apparatus of claim 1, further comprising:
a stage adjacent to the processing chamber; and
a substrate loader coupled to the stage and the processing chamber.

3. The apparatus of claim 2, wherein the substrate loader comprises a robot that rotates each substrate about an axis parallel to a diameter of the substrate.

4. The apparatus of claim 2, wherein the means for flipping substrates comprises a robot that rotates each substrate about an axis parallel to a diameter of the substrate.

5. The apparatus of claim 1, wherein the processing chamber is a plasma immersion ion implantation chamber.

6. The apparatus of claim 1, wherein the means for modifying the magnetic properties comprises an external plasma source.

7. The apparatus of claim 1, wherein the means for modifying the magnetic properties comprises a circulating plasma source.

8. The apparatus of claim 1, wherein the means for modifying the magnetic properties comprises two circulating plasma sources.

9. The apparatus of claim 1, wherein the substrate support platter is removable through an opening in a wall of the processing chamber.

10. The apparatus of claim 1, wherein the means for modifying the magnetic properties of the at least two major surfaces of each substrate comprises an inductive plasma source.

11. The apparatus of claim 10, wherein the two major surfaces of each substrate are exposed to the inductive plasma source sequentially.

12. The apparatus of claim 10, wherein the inductive plasma source is a circulating plasma source.

13. The apparatus of claim 12, wherein the substrate support platter is removable through an opening in a wall of the processing chamber.

14. An apparatus for processing magnetic substrates, comprising:

a processing chamber;

a removable substrate support platter comprising a plurality of laterally displaced substrate locations provided thereon;

means for flipping substrates to enable exposing at least two major surfaces of each substrate to a processing environment in the processing chamber; and means for modifying the magnetic properties of the at least two major surfaces of each substrate by exposing the surfaces to a circulating plasma.

15. The apparatus of claim 14, wherein the means for modifying the magnetic properties comprises an external plasma source.

16. The apparatus of claim 14, wherein the substrate support platter can pass through an opening in a wall of the chamber.

17. The apparatus of claim 14, wherein the means for modifying the magnetic properties comprises an inductive plasma source.

18. The apparatus of claim 17, wherein the means for modifying the magnetic properties comprises two external inductive plasma sources.

19. The apparatus of claim 18, wherein the substrate support platter can pass through an opening in a wall of the chamber.

* * * * *